(12) United States Patent
Baba-Ali et al.

(10) Patent No.: US 7,445,883 B2
(45) Date of Patent: *Nov. 4, 2008

(54) LITHOGRAPHIC PRINTING WITH POLARIZED LIGHT

(75) Inventors: Nabila Baba-Ali, Ridgefield, CT (US); Justin Kreuzer, Trumball, CT (US); Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/503,113

(22) Filed: Aug. 14, 2006

(65) Prior Publication Data

US 2006/0275708 A1    Dec. 7, 2006

Related U.S. Application Data

(63) Continuation of application No. 10/781,803, filed on Feb. 20, 2004, now Pat. No. 7,090,964.

(60) Provisional application No. 60/448,530, filed on Feb. 21, 2003.

(51) Int. Cl.
  G02B 5/30      (2006.01)
  G03B 27/72     (2006.01)
(52) U.S. Cl. .................. 430/311; 359/499; 359/483; 355/77; 355/67
(58) Field of Classification Search .................. None
  See application file for complete search history.

(56) References Cited

U.S. PATENT DOCUMENTS

| | | | |
|---|---|---|---|
| 3,917,399 A | 11/1975 | Buzawa et al. | |
| 5,144,362 A | 9/1992 | Kamon et al. | |
| 5,436,761 A | 7/1995 | Kamon | |
| 5,442,184 A | 8/1995 | Palmer et al. | |
| 5,467,166 A | 11/1995 | Shiraishi | |
| 5,537,260 A | 7/1996 | Williamson | |
| 5,539,514 A | 7/1996 | Shishido et al. | |
| 5,541,026 A | 7/1996 | Matsumoto | |
| 6,108,140 A | 8/2000 | Hashimoto et al. | |
| 6,163,367 A | 12/2000 | Obszarny | |
| 6,229,647 B1 | 5/2001 | Takahashi et al. | |
| 6,404,482 B1 | 6/2002 | Shiraishi | |
| 6,819,405 B2 | 11/2004 | Mulkens et al. | |
| 7,090,964 B2 * | 8/2006 | Baba-Ali et al. ............ | 430/311 |
| 2002/0176166 A1 | 11/2002 | Schuster | |
| 2004/0075895 A1 * | 4/2004 | Lin ............................. | 359/380 |
| 2004/0245439 A1 | 12/2004 | Shaver | |

FOREIGN PATENT DOCUMENTS

| | | | |
|---|---|---|---|
| EP | 1 091 252 A2 | 4/2001 | |
| JP | 05-090128 A | 4/1993 | |
| JP | 07-094399 A | 4/1995 | |
| JP | 07-122469 A | 5/1995 | |
| JP | 09-160219 A | 6/1997 | |
| JP | 11-191532 A | 7/1999 | |
| JP | 2006-135346 A | 5/2006 | |
| KR | 137348 | 2/1998 | |
| KR | 2003-6953 | 1/2003 | |
| WO | WO 01/22164 | 3/2001 | |

OTHER PUBLICATIONS

European Search Report for European Application No. 04713708.8—1226 dated Jul. 24, 2007, three (3) pages.
Translation of Office Action and Office Action for Japanese Patent Application No. 2005-501718 mailed Dec. 26, 2007, 8 pgs.
"Understanding the Forbidden Pitch Phenomenon and Assist Feature Placement," Shi et al., SPIE vol. 4689: 985-996 (2002). cited by other.
"Forbidden Pitches for 130nm Lithography and Below," Socha et al., SPIE vol. 4000: 1140-1155 (2000). cited by other.
A. K. Wong, Resolution Enhancement Techniques in Optical Lithography, SPIE Press, pp. 28-29. cited by other, no date.
"Impact of Illumination Coherence and Polarization on the Imaging of Attenuated Phase Shift Masks," Ma et al., SPIE vol. 4346: 1522-1532 (2001). cited by other.
"Solutions for Printing Sub 100nm contacts with ArF," Graupner et al., SPIE vol. 4691: 503-514 (2002). cited by other.
"The Vortex Via Mask: Making 80nm Contacts With a Twist!," Levenson et al., SPIE vol. 4889 (2002). cited by other.
"Overcoming the Resolution Challenge Using Special Illumination Techniques to Print 50/50 nm Nested Contact Holes at 157 nm Wavelength," Baba-Ali et al., SPIE vol. 5040: 1352-1363 (2003). cited by other.
Office Action for Korean Patent Application No. 10-2004-7016864, mailed Mar. 22, 2006, 2 pages. cited by other.
English translation of the Examiner's Ground for Rejection for Korean Patent Application No. 10-2004-7016864, 1 page. cited by other.

* cited by examiner

*Primary Examiner*—John A. McPherson
*Assistant Examiner*—Daborah Chacko Davis
(74) *Attorney, Agent, or Firm*—Sterne, Kessler, Goldstein & Fox P.L.L.C.

(57) ABSTRACT

The present invention provides systems and methods for improved lithographic printing with polarized light. In embodiments of the present invention, polarized light (radially or tangentially polarized) is used to illuminate a phase-shift mask (PSM) and produce an exposure beam. A negative photoresist layer is then exposed by light in the exposure beam. A chromeless PSM can be used. In further embodiments of the present invention, radially polarized light is used to illuminate a mask and produce an exposure beam. A positive photoresist layer is then exposed by light in the exposure beam. The mask can be an attenuating PSM or binary mask. A very high image quality is obtained even when printing contact holes at various pitches in low k applications.

19 Claims, 39 Drawing Sheets

AERIAL IMAGE AT BEST FOCUS
125 nm PITCH, 6% Att PSM, 75 nm CONTACT WIDTH
QUADRUPOLE ILLUMINATION, TANGENTIAL POLARIZATION,
$C_1=0.17$, $C_2=0.76$
$NILS_1=0.53$, $NILS_2=0.81$

AERIAL IMAGE AT BEST FOCUS
125 nm PITCH, 6% Att PSM, 75 nm CONTACT WIDTH
QUADRUPOLE ILLUMINATION, RADIAL POLARIZATION,
$C_1=0.53, C_2=0.51$
$NILS_1=1.60, NILS_2=1.47$

LITHOGRAPHIC PRINTING WITH POLARIZED LIGHT

CLAIM TO PRIORITY

This application is a continuation of U.S. Non-provisional Appl. Ser. No. 10/781,803, filed, Feb. 20, 2004, of like title, which claims priority to U.S. Provisional Appl. No. 60/448, 530, filed Feb. 21, 2003. Both are incorporated herein by reference in their entirety.

BACKGROUND OF THE INVENTION

1. Field of the Invention

The present invention relates to high numerical aperture and immersion lithography.

2. Related Art

Lithographic tools and techniques are increasingly called upon to print patterns at a high resolution. For example, in the manufacture of semiconductor dies or chips, patterns of circuit features, such as lines, contact holes, or other elements, often need to be printed at a high resolution to improve the packing density of circuit elements and reduce the pitch of the pattern. Certain circuit features, such as contact holes or vias, are especially difficult to fabricate.

A well-known parameter relating to lithography resolution is the critical dimension (CD). The CD is the size of the smallest geometrical features which can be formed during semiconductor device and circuit manufacturing using a given technology. The critical dimension can be described as shown in the following function:

$$CD = k(\lambda/NA),$$

where $\lambda$ is a wavelength used in lithography, NA is the numeric aperture, and k is the dielectric constant. Among the trends in lithography is to reduce the CD by lowering the wavelength used, increasing the numeric aperture, and reducing the value k.

Printing can be difficult in low k applications. For example, contact holes are difficult to print when k is less than 0.5. A high-contrast image of sufficient quality that includes groups of contacts holes like contact arrays is especially hard to print.

Techniques to enhance contrast using a very high NA and off-axis illumination have been used but these techniques fail for small pitches. For example, at 157 nm wavelength, 0.93 NA, the limiting pitch (based on resolution) is roughly 135 nm (k=0.4)—which is too high for certain applications. Also, a forbidden pitch may occur. This means that if the illumination is optimized for a given pitch, printing other pitches simultaneously may become impossible. Forbidden pitch can be manifested in a low normalized image log slope (NILS) or poor CD control for the forbidden pitch.

SUMMARY OF THE INVENTION

The present invention provides systems and methods for improved lithographic printing with polarized light.

In embodiments of the present invention, polarized light (for example, radially, tangentially, or custom polarized) is used to illuminate a phase-shift mask (PSM) and produce an exposure beam. A negative photoresist layer is then exposed by light in the exposure beam. A chromeless PSM can be used. In one example embodiment, radially polarized light is used in conjunction with chromeless PSMs, Cartesian quadrupole (C-quad) illumination and negative photoresists. A very high image quality is obtained even when printing contact holes at various pitches in low k applications. Forbidden pitch is avoided.

In further embodiments of the present invention, radially polarized light is used to illuminate a mask and produce an exposure beam. A positive photoresist layer is then exposed by light in the exposure beam. The mask can be an attenuating PSM or binary mask. In one example embodiment, radially polarized light is used in conjunction with attenuating phase-shift masks or binary masks, standard diagonal quadrupole illumination and positive photoresists. A very high image quality is obtained even when printing contact holes at various pitches in low k applications.

To further improve printing, a custom polarization can be used. The custom polarization may be, for example, a combination of radial and tangential polarization. In addition, an alternating PSM can also be used to improve print quality.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 9A:
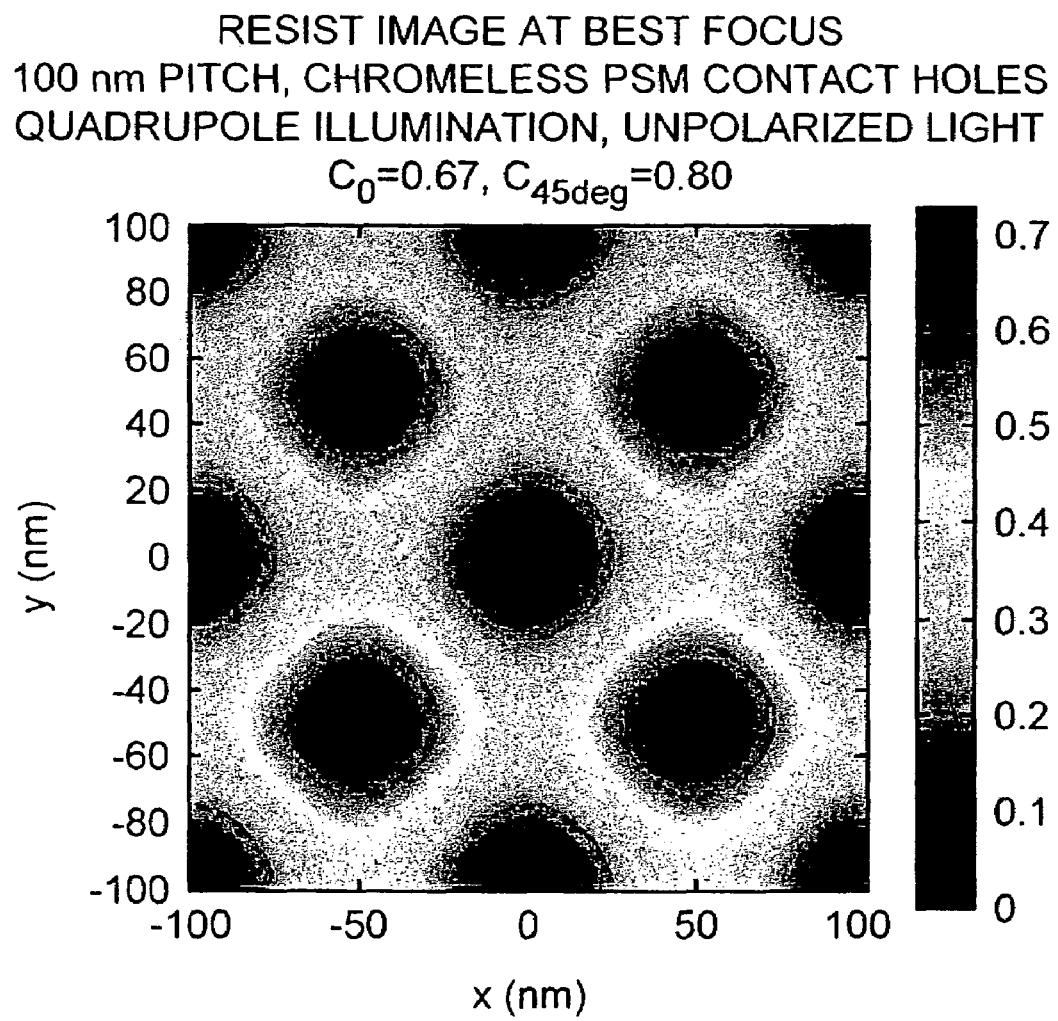
Figure 9B:
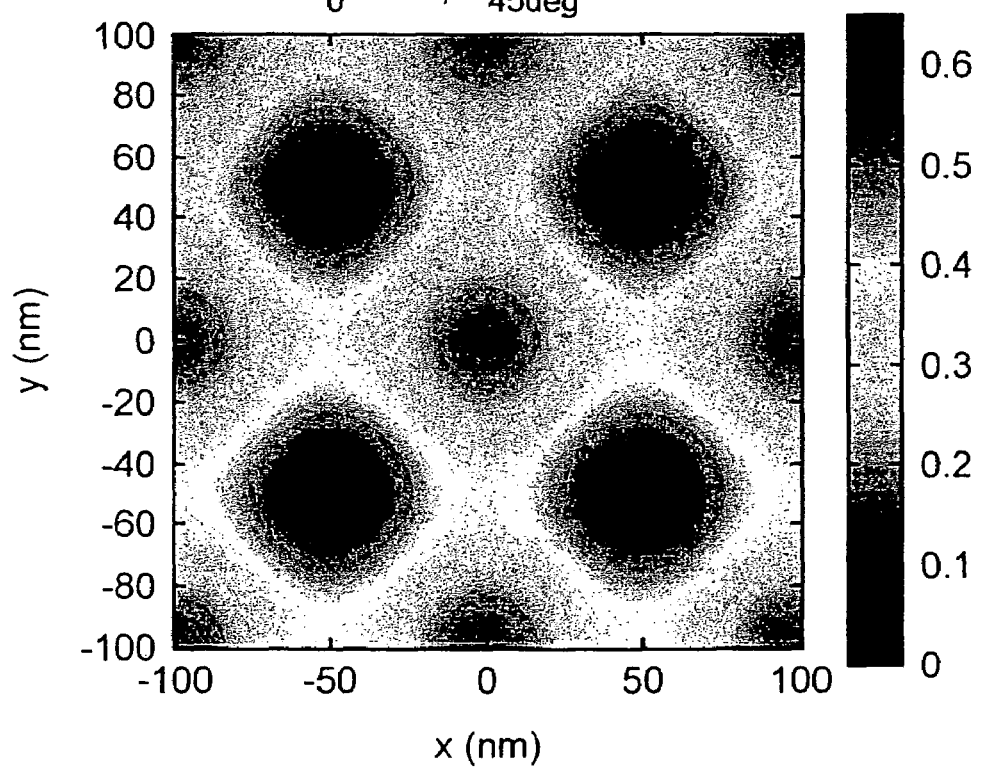
Figure 9C:
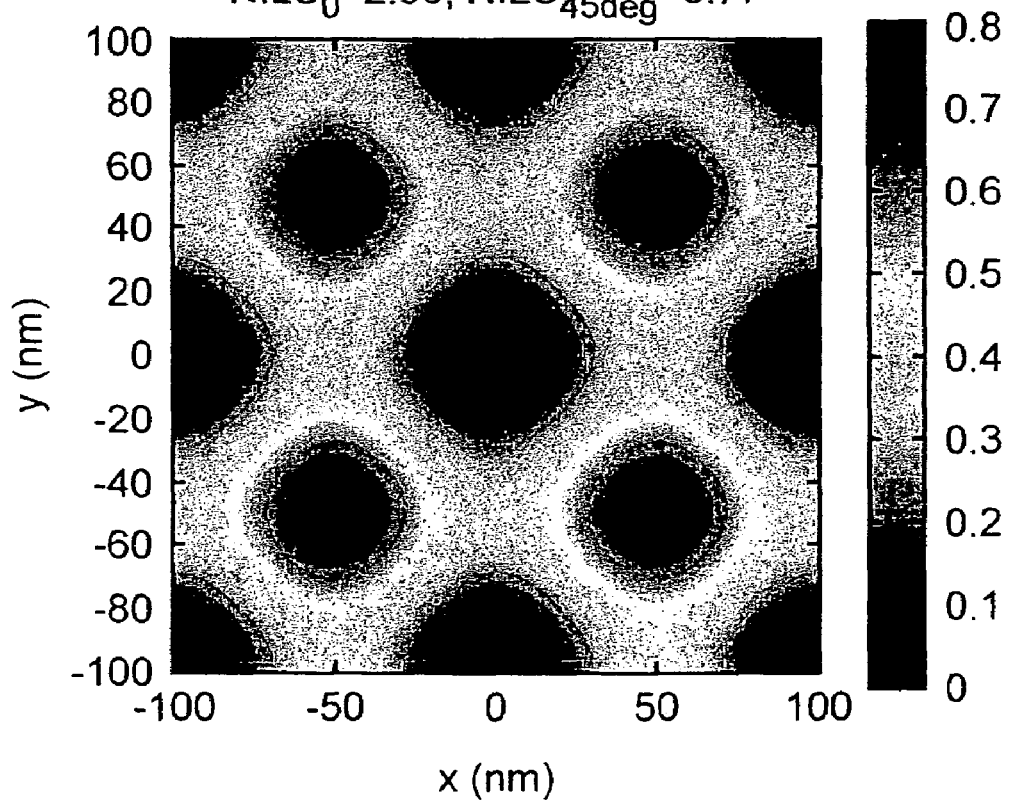

FIGS. 9A-9C illustrate effects of polarization on image quality. FIG. 9A illustrates a poor contrast image of grouped contact holes obtained in a case using unpolarized light. FIG. 9B illustrates a poor contrast image of grouped contact holes obtained in a case using tangentially polarized light. FIG. 9C illustrates a high contrast image of grouped contact holes obtained in a case using radially polarized light according to an embodiment of the present invention.

Figure 10A:
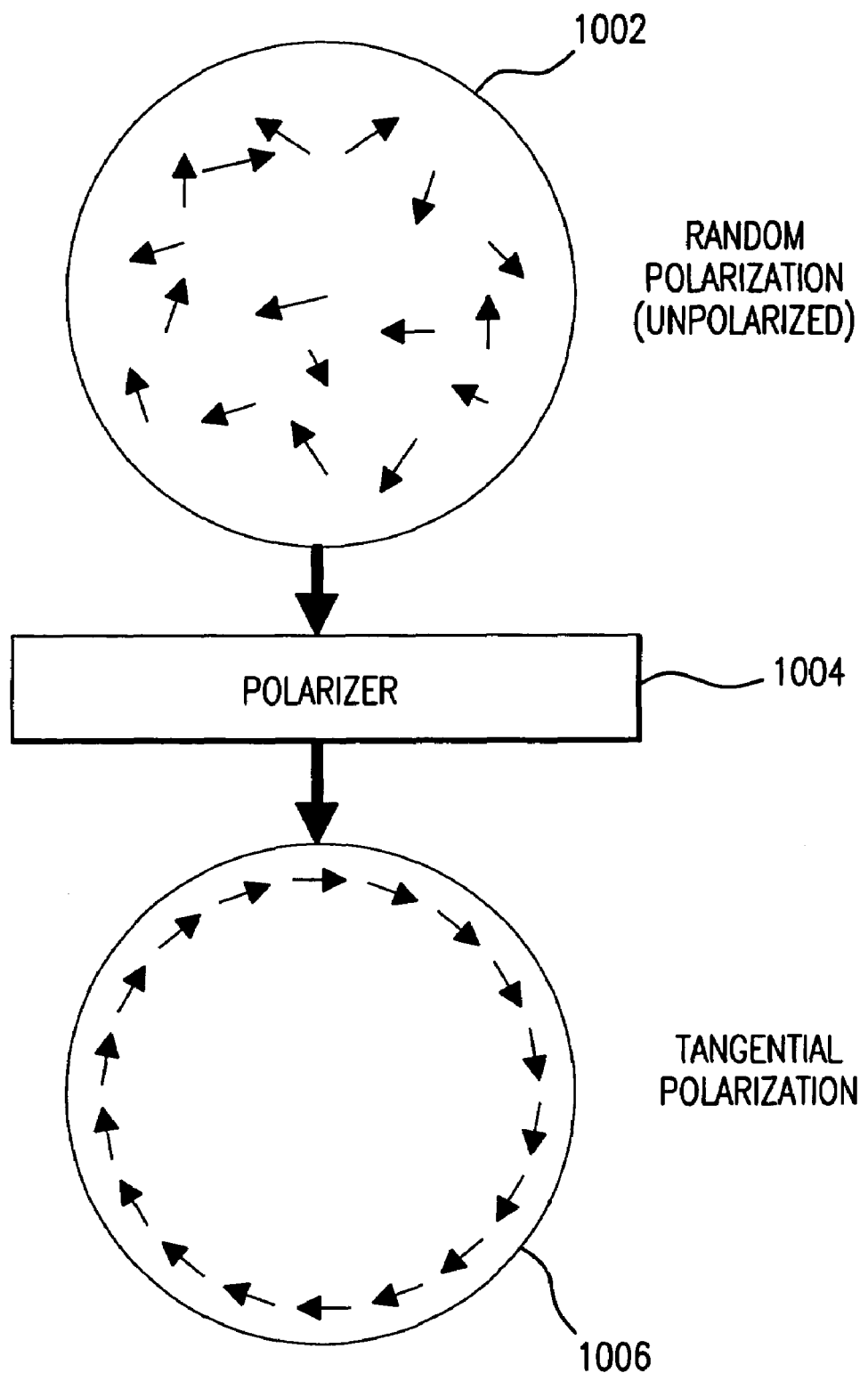

FIG. 10A illustrates the effect of a tangential polarizer on electric field vectors in light.

Figure 10B:
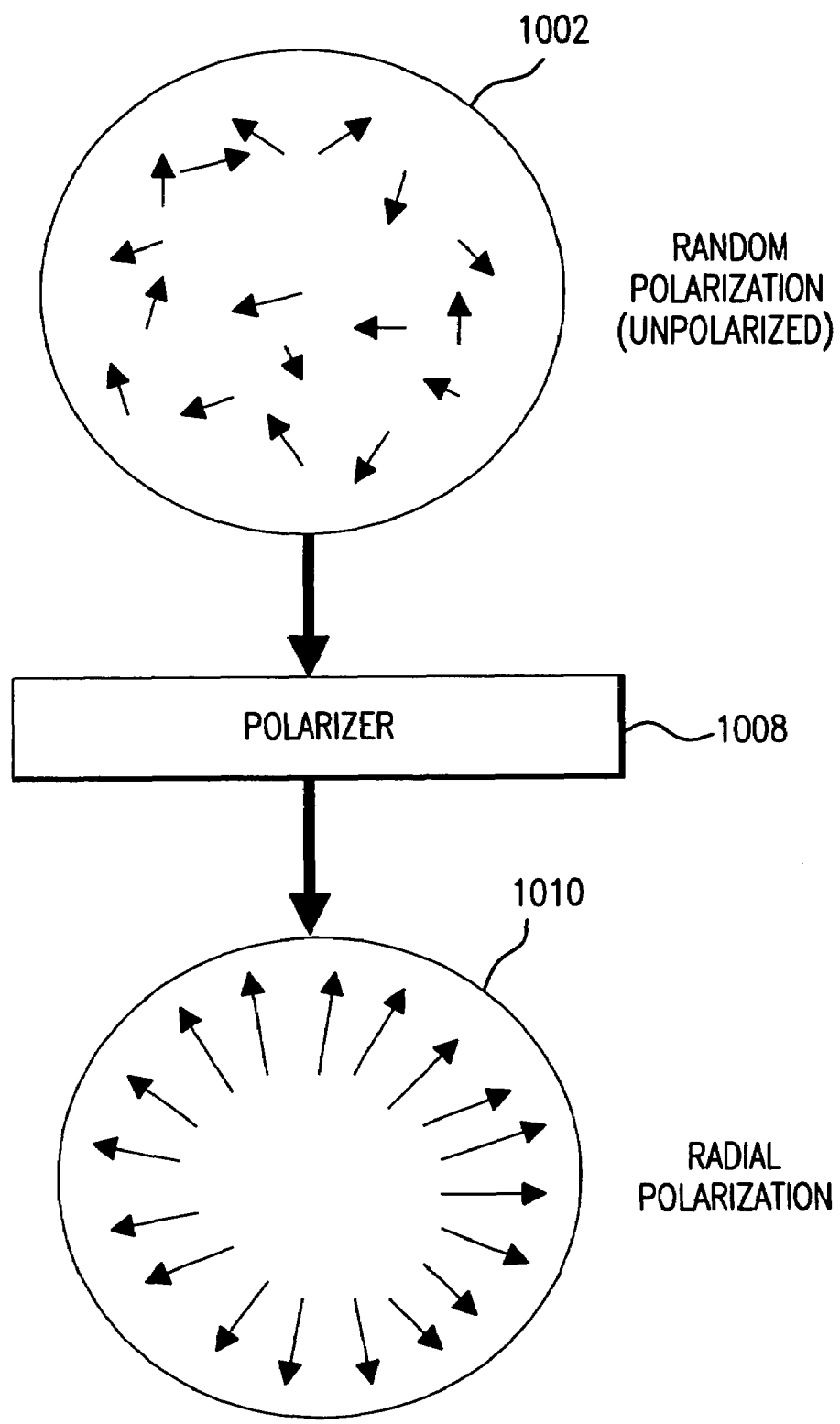

FIG. 10B illustrates the effect of a radial polarizer on electric field vectors in light.

Figure 11A:
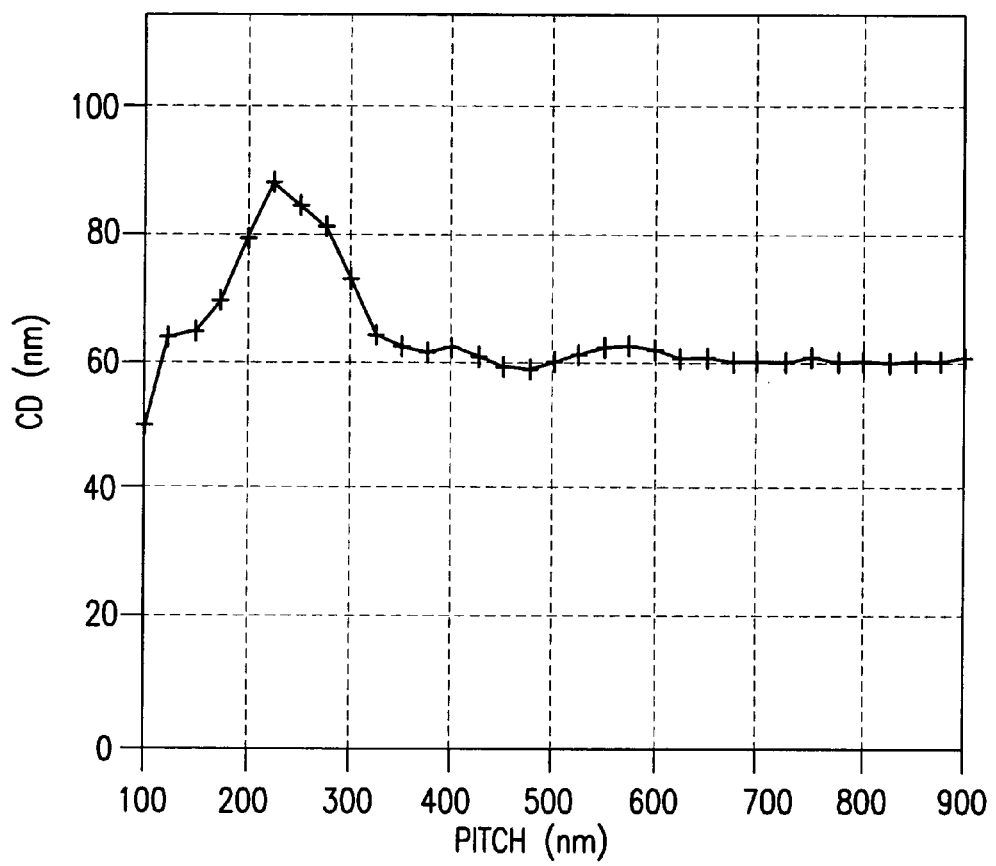
Figure 11B:
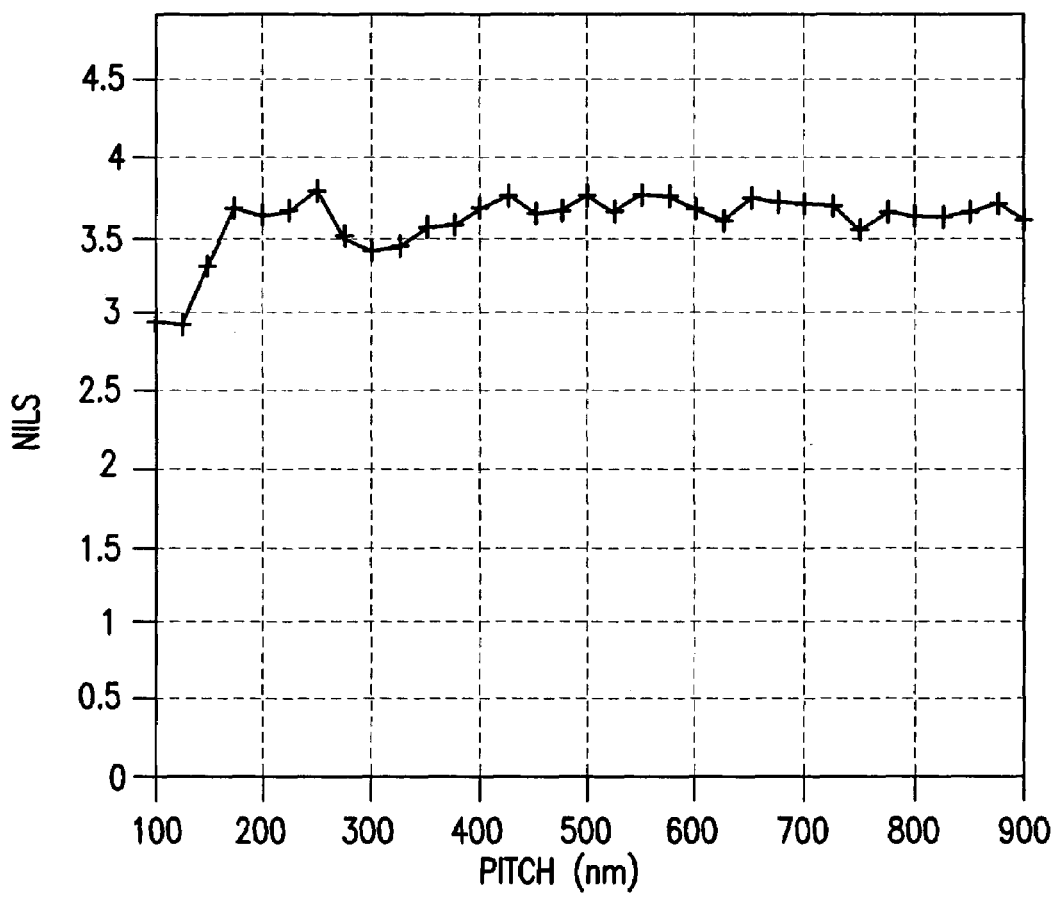

FIGS. 11A and 11B are diagrams that show through pitch behavior using radially polarized light with a chromeless, alternating PSM according to an embodiment of the present invention.

Figure 12:
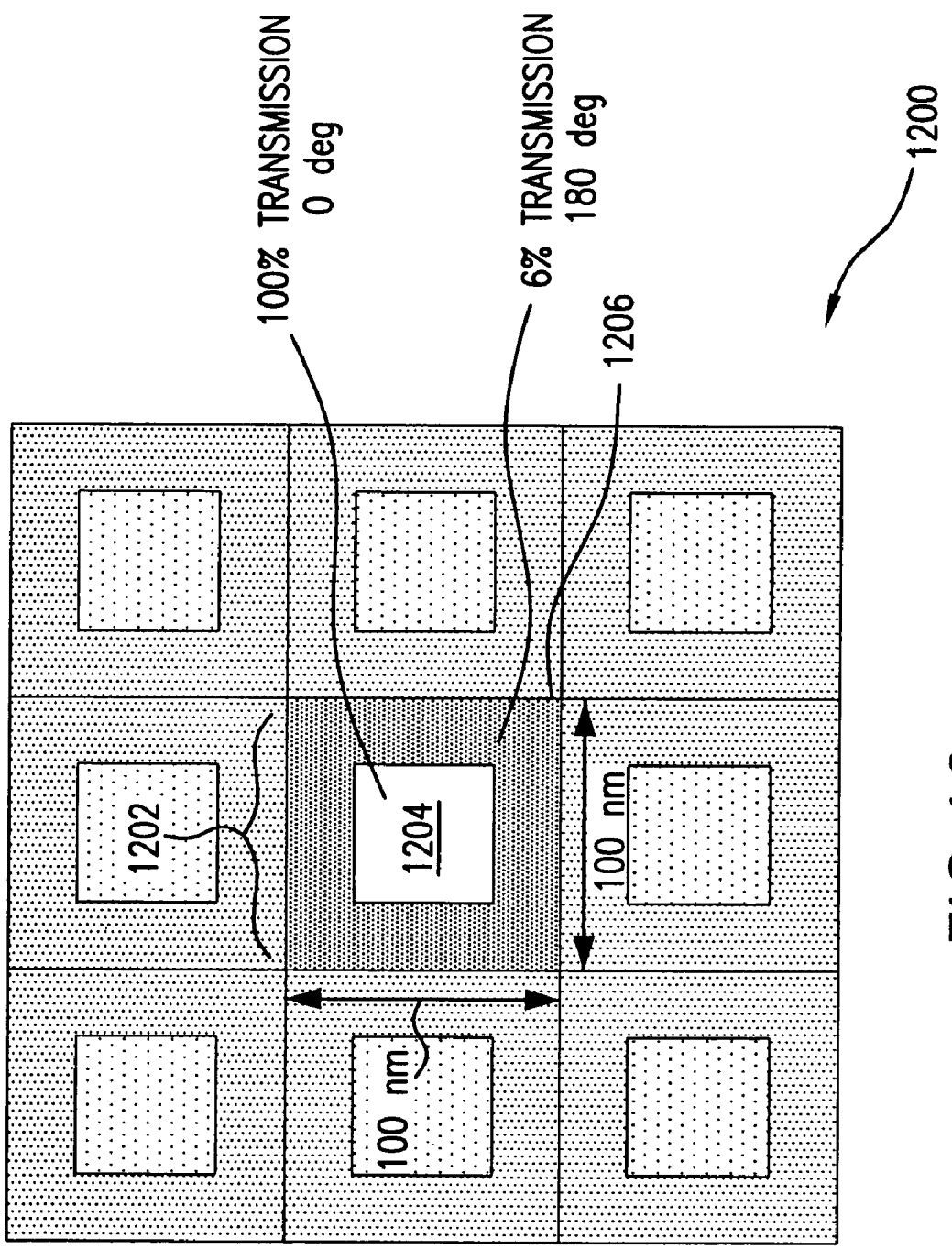

FIG. 12 is an illustration of an attenuating PSM.

Figure 13:
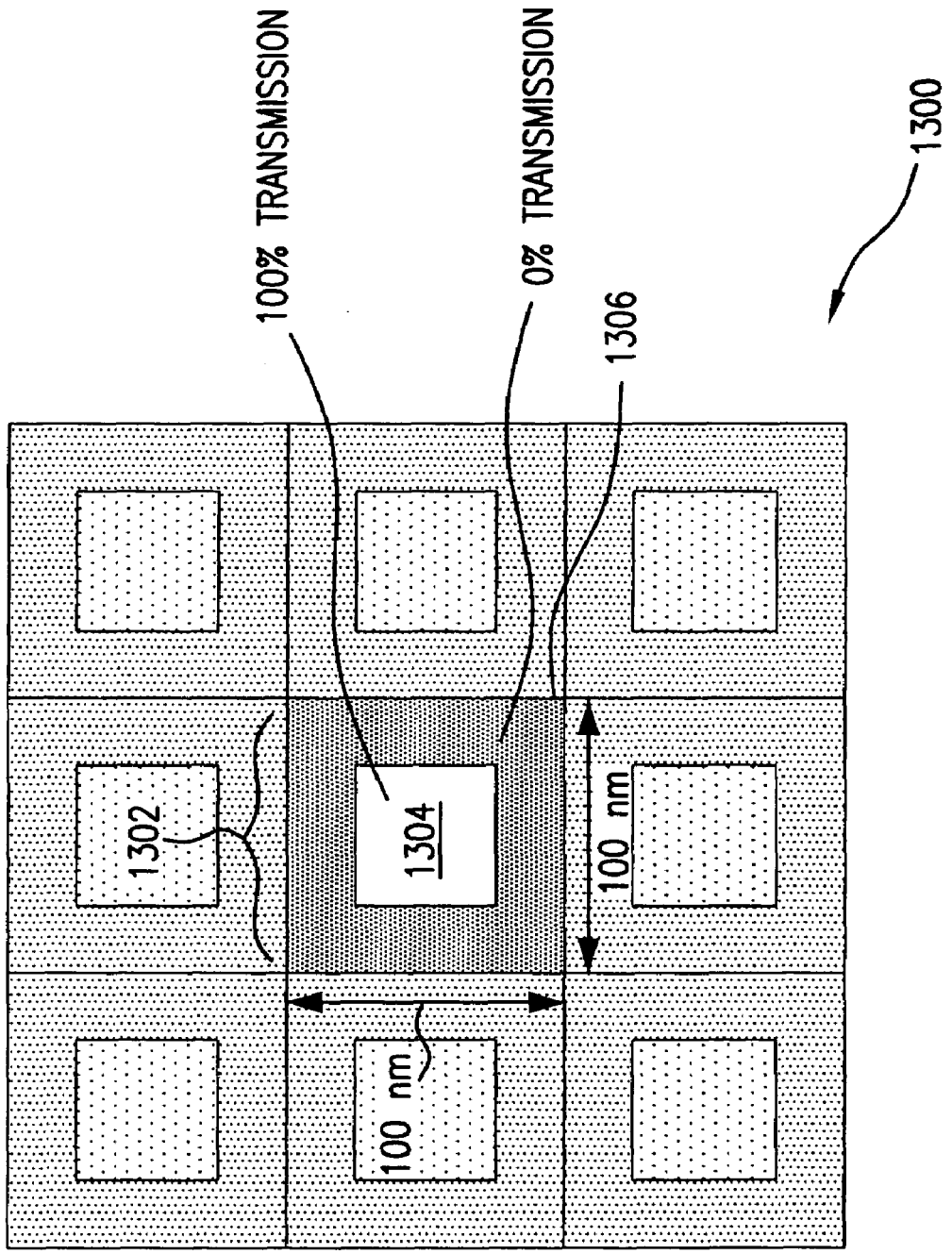

FIG. 13 is an illustration of a binary PSM.

Figure 14A:
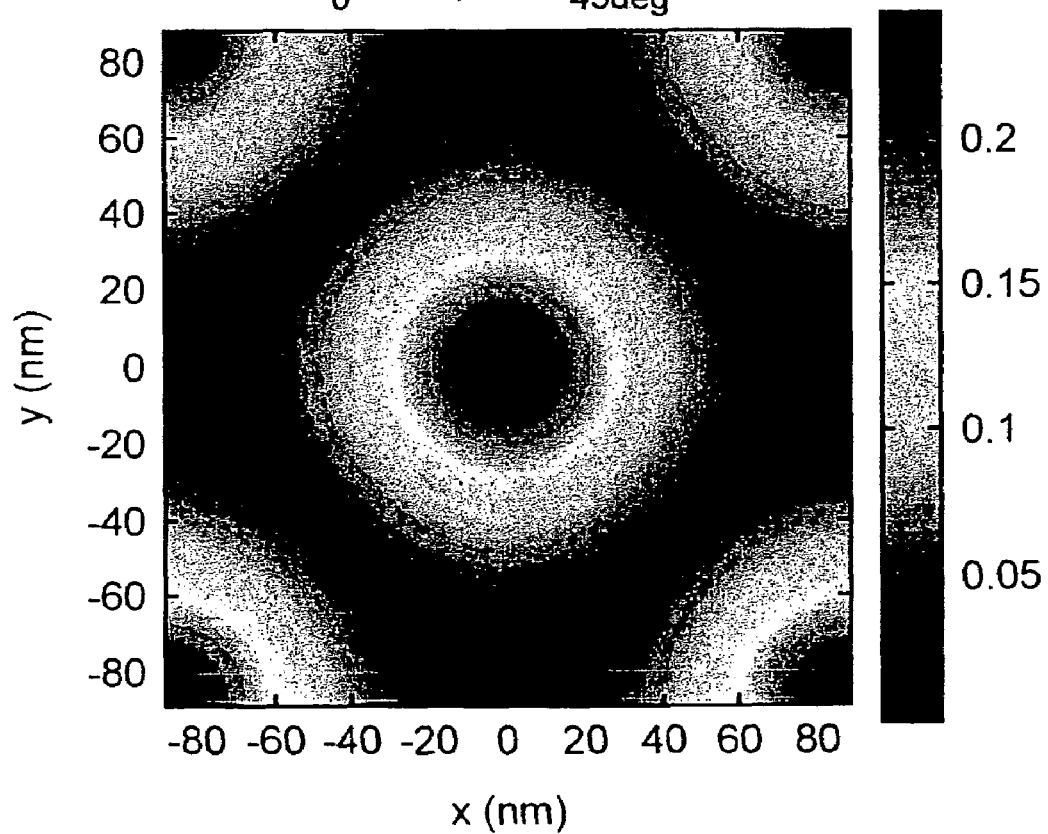
Figure 14B:
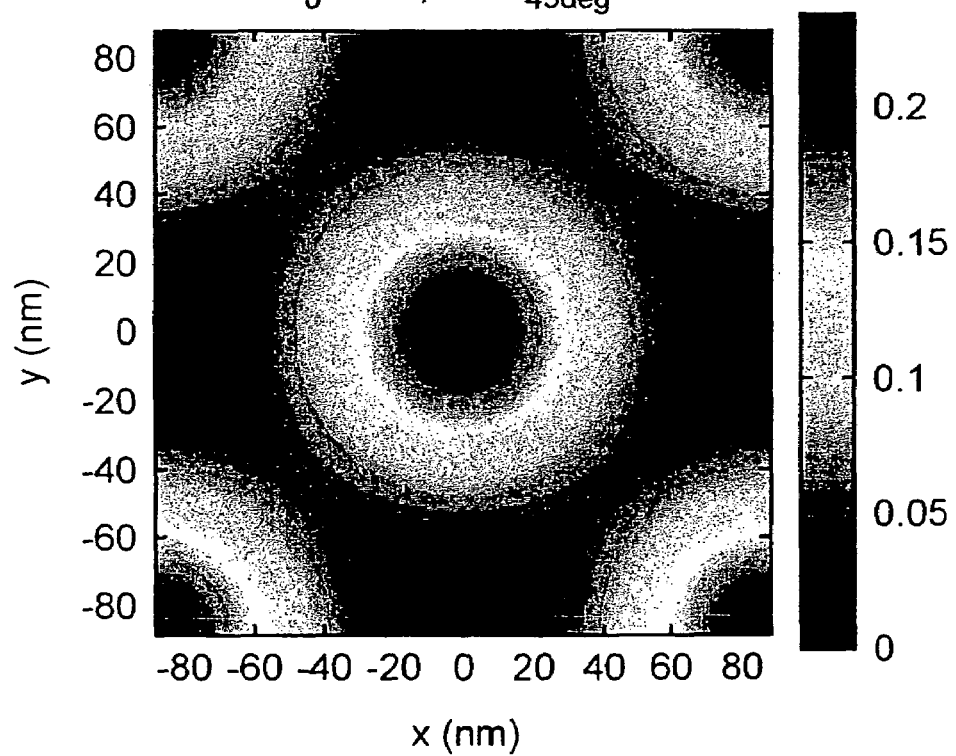
Figure 14C:
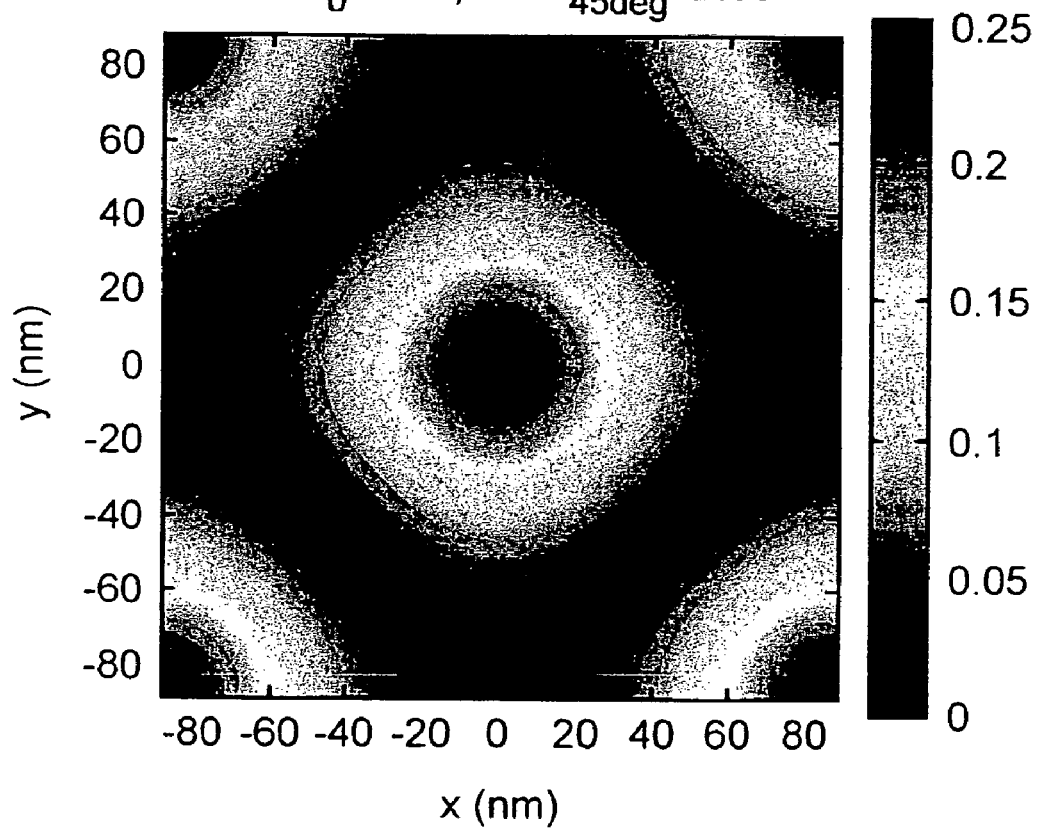

FIGS. 14A-14C are images that show effects of polarization on image quality in the case of an attenuating PSM, 125 nm pitch according to an embodiment of the present invention.

Figure 15:
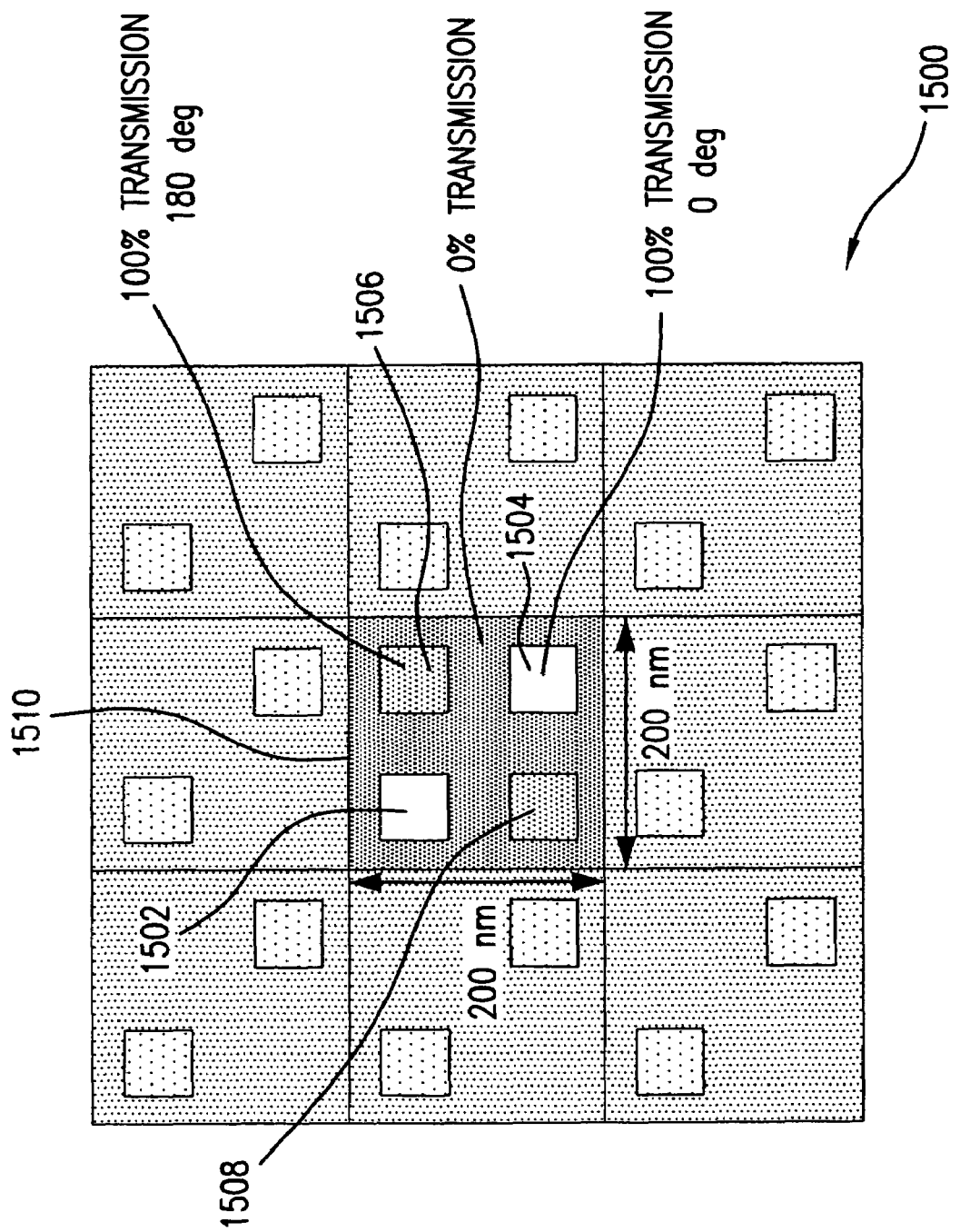

FIG. 15 is an illustration of an alternating PSM.

Figure 16:
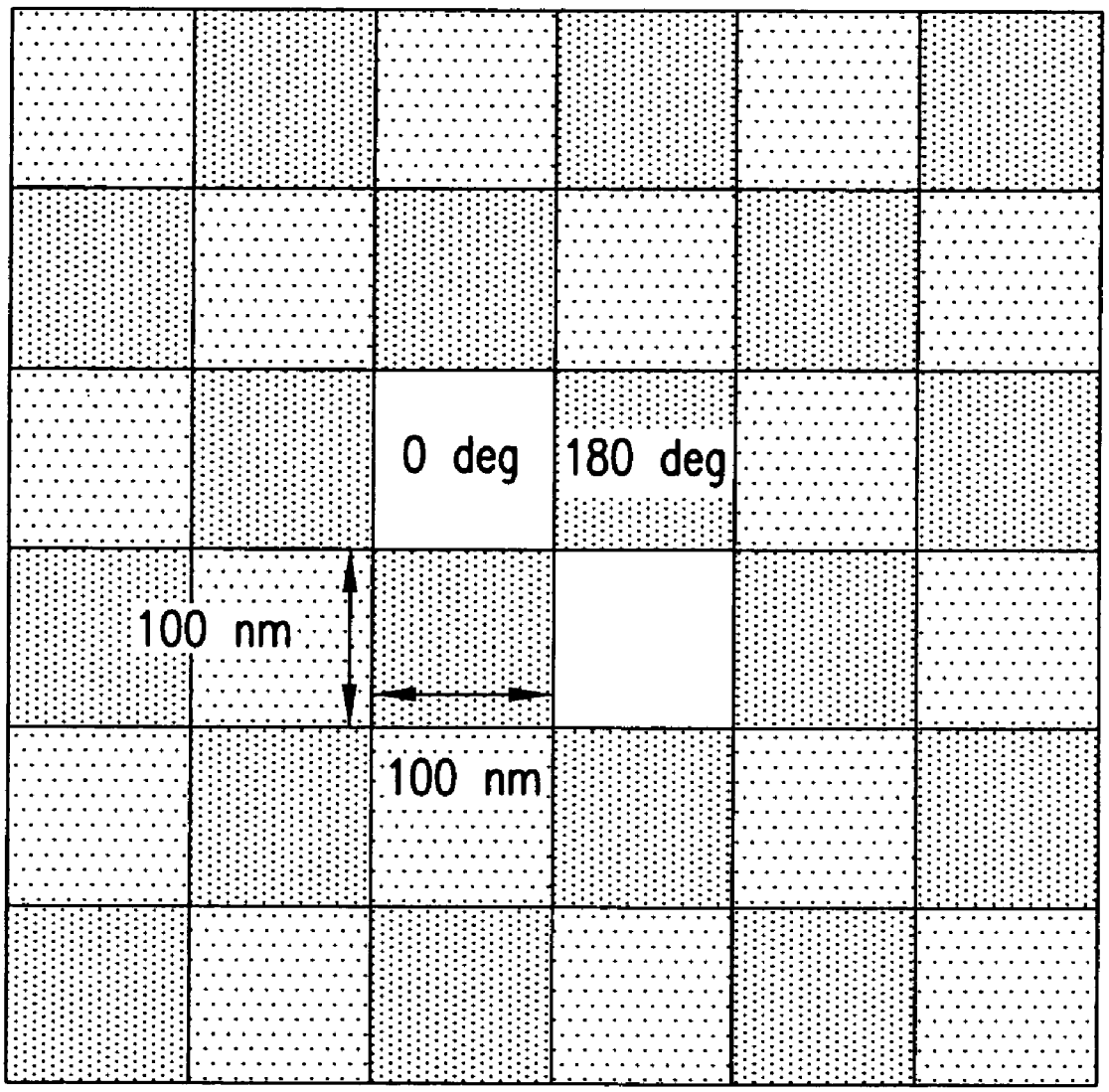

FIG. 16 shows a chromeless alternating PSM mask layout.

Figure 5:
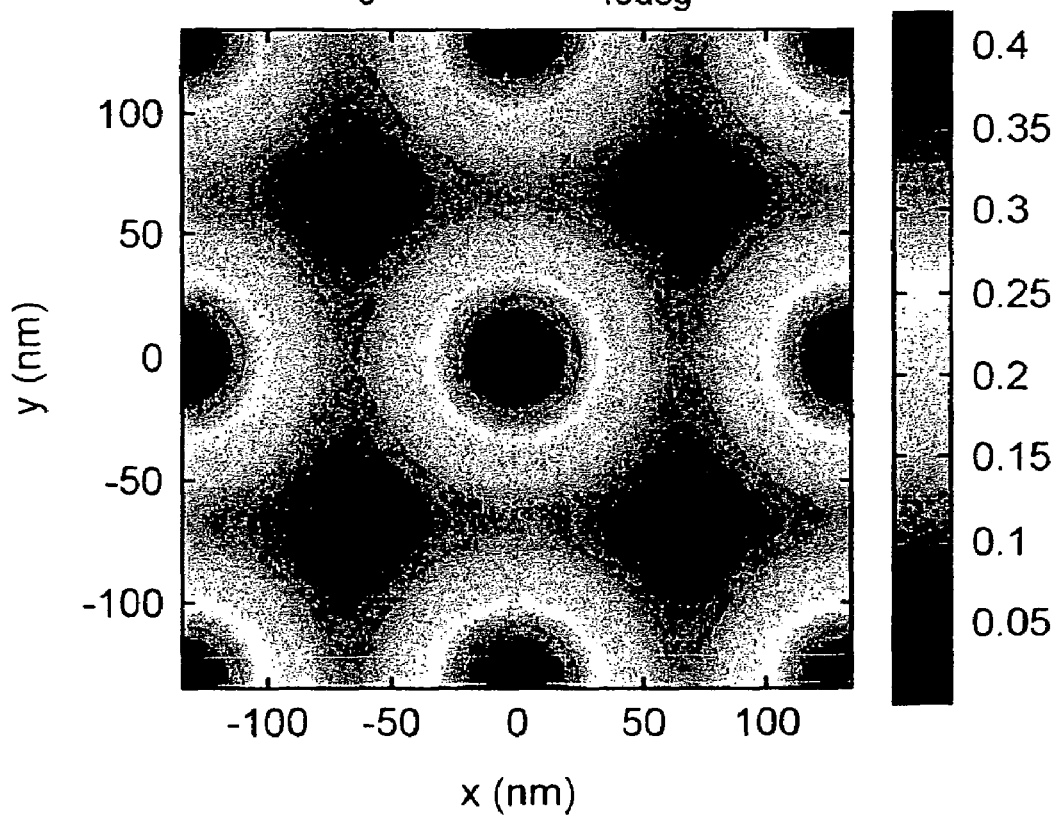
FIG. 5 is an image that shows a limiting pitch with unpolarized light, where $C_0$ and $C_{45}$ are the orthogonal and diagonal contrasts, respectively.
Figure 17A:
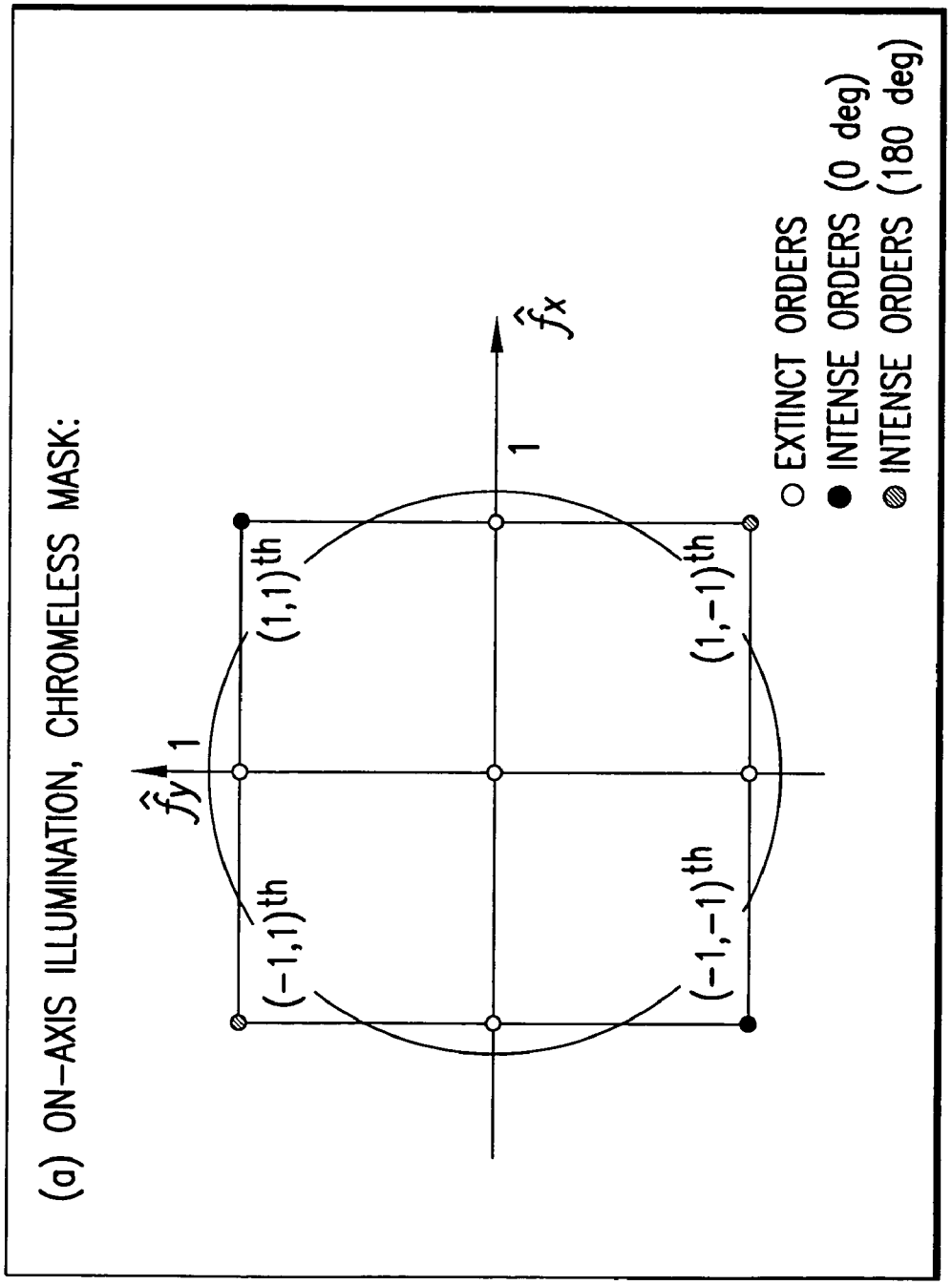
Figure 17B:
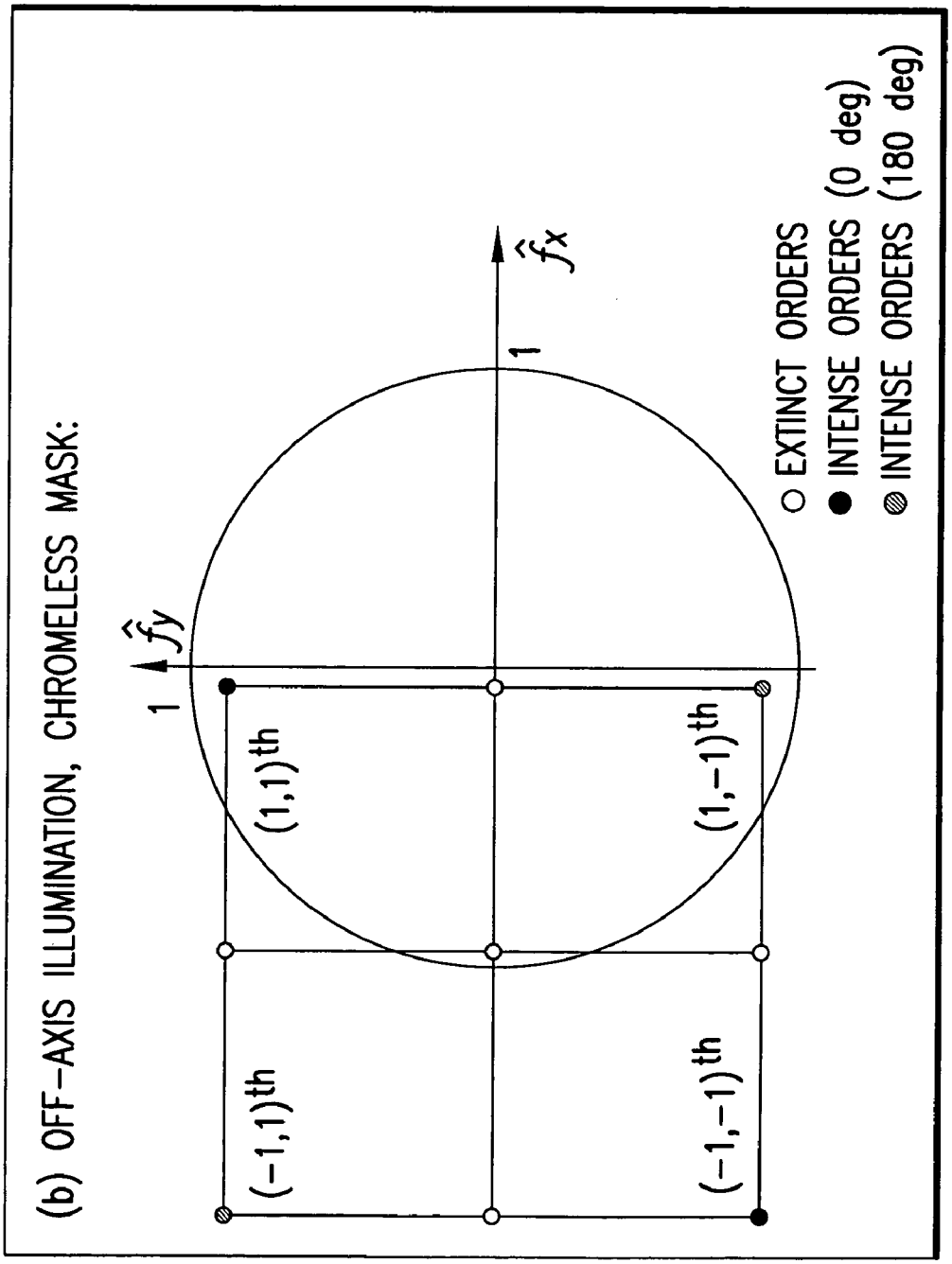

FIGS. 17A and 17B show diffraction patterns for the 2D chromeless alternating PSM for on-axis and off-axis illumination respectively. FIG. 5 is an image that shows a limiting pitch with unpolarized light, where $C_0$ and $C_{45}$ are the orthogonal and diagonal contrasts, respectively.

Figure 18A:
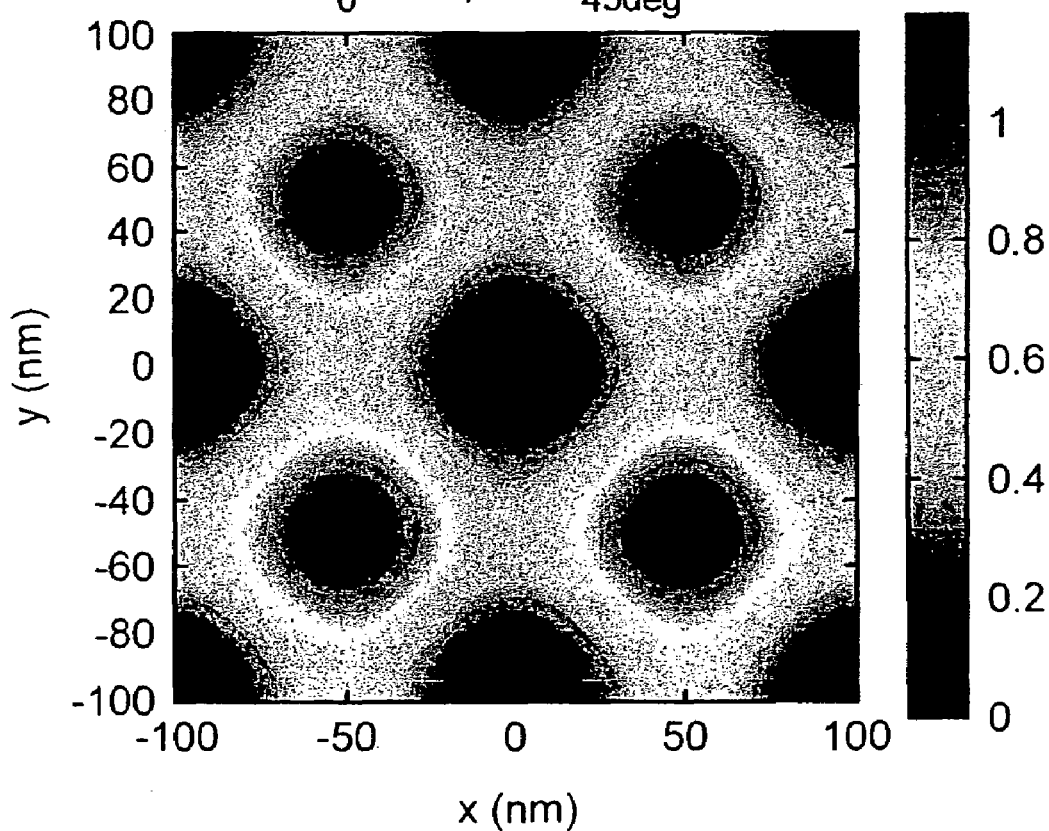
Figure 18B:
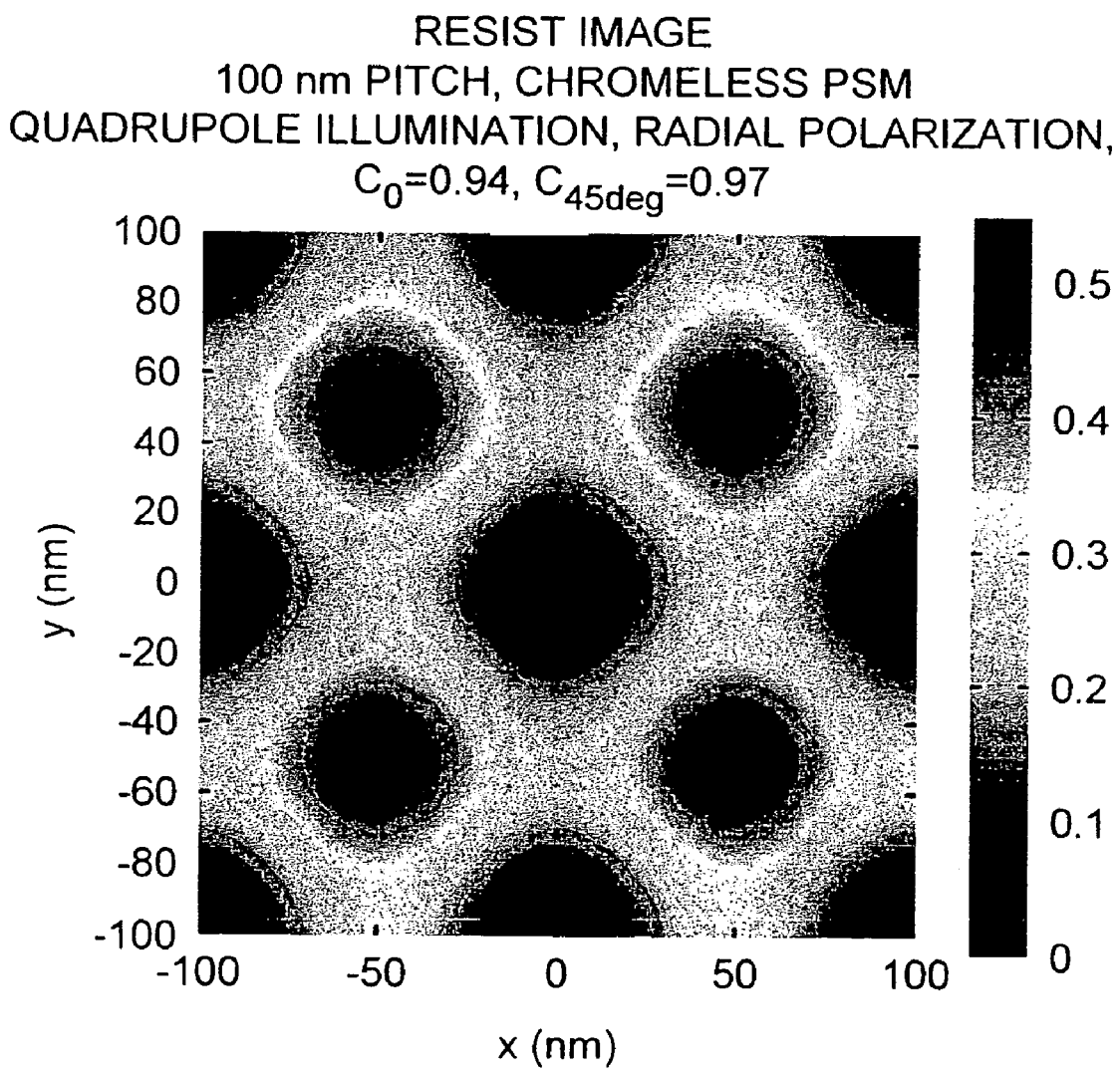

FIGS. 18A and 18B show images in air (a) and in resist (b) using an example chromeless alternating PSM.

Figure 19A:
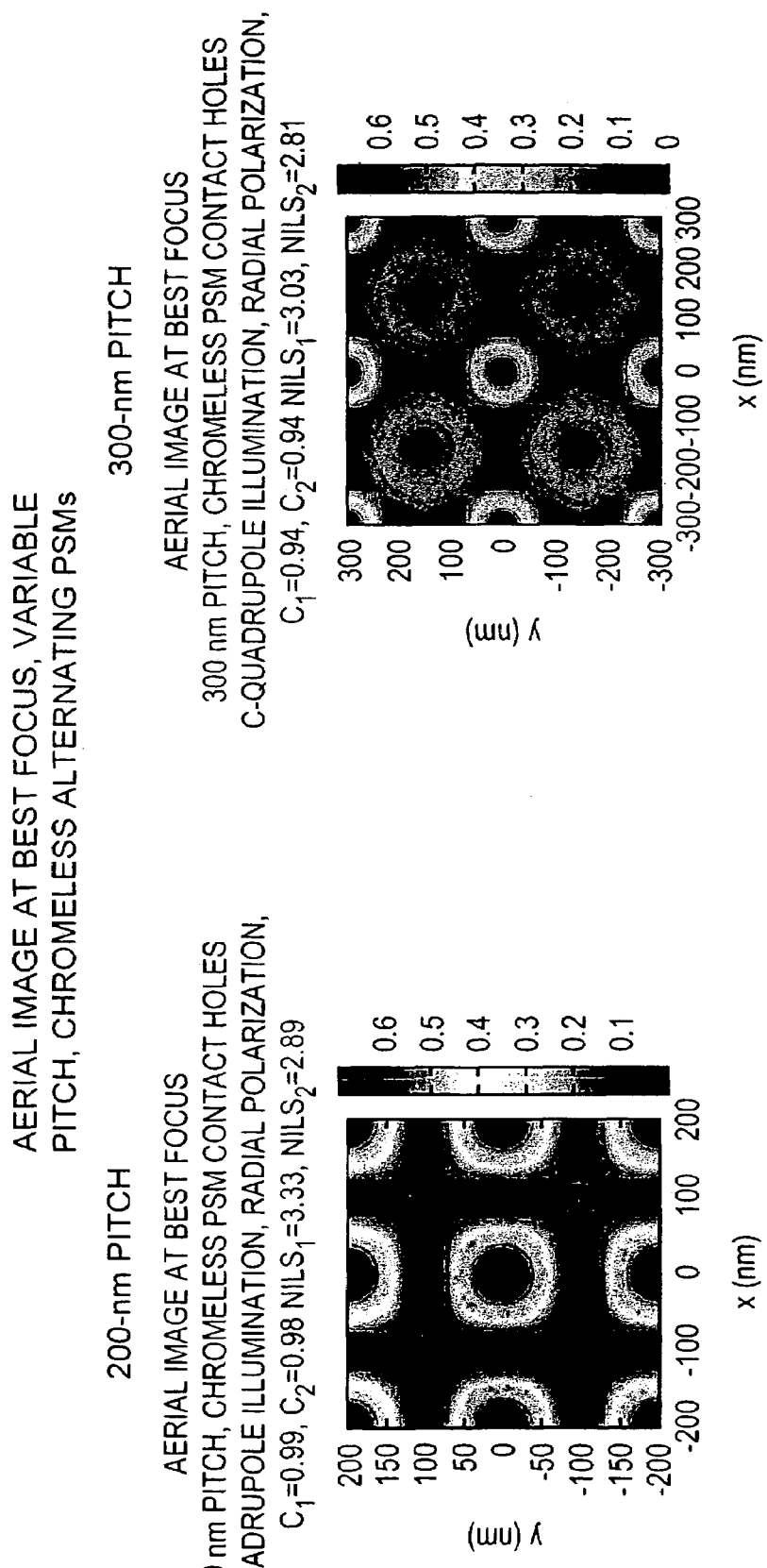
Figure 19B:
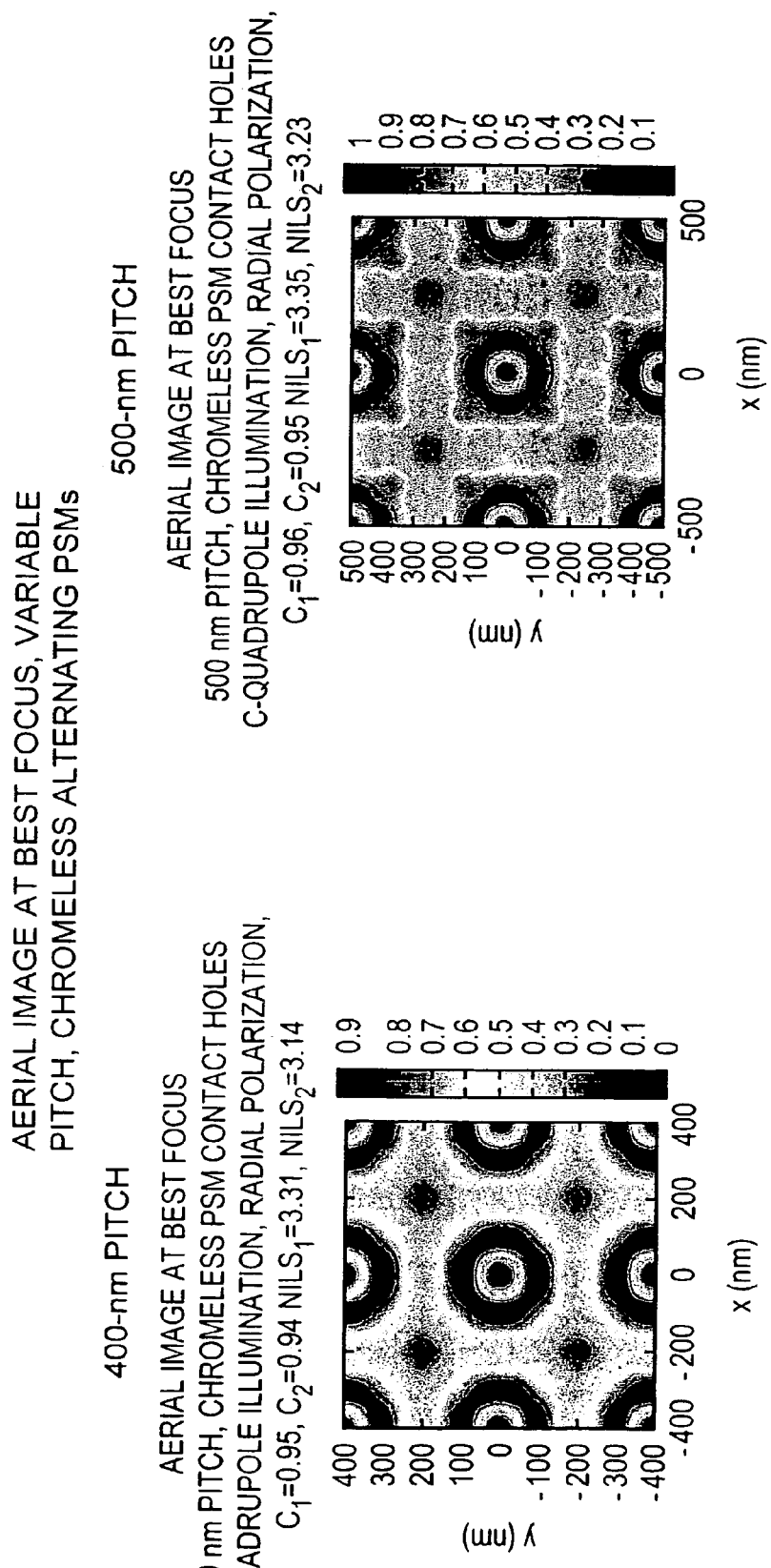
Figure 19C:
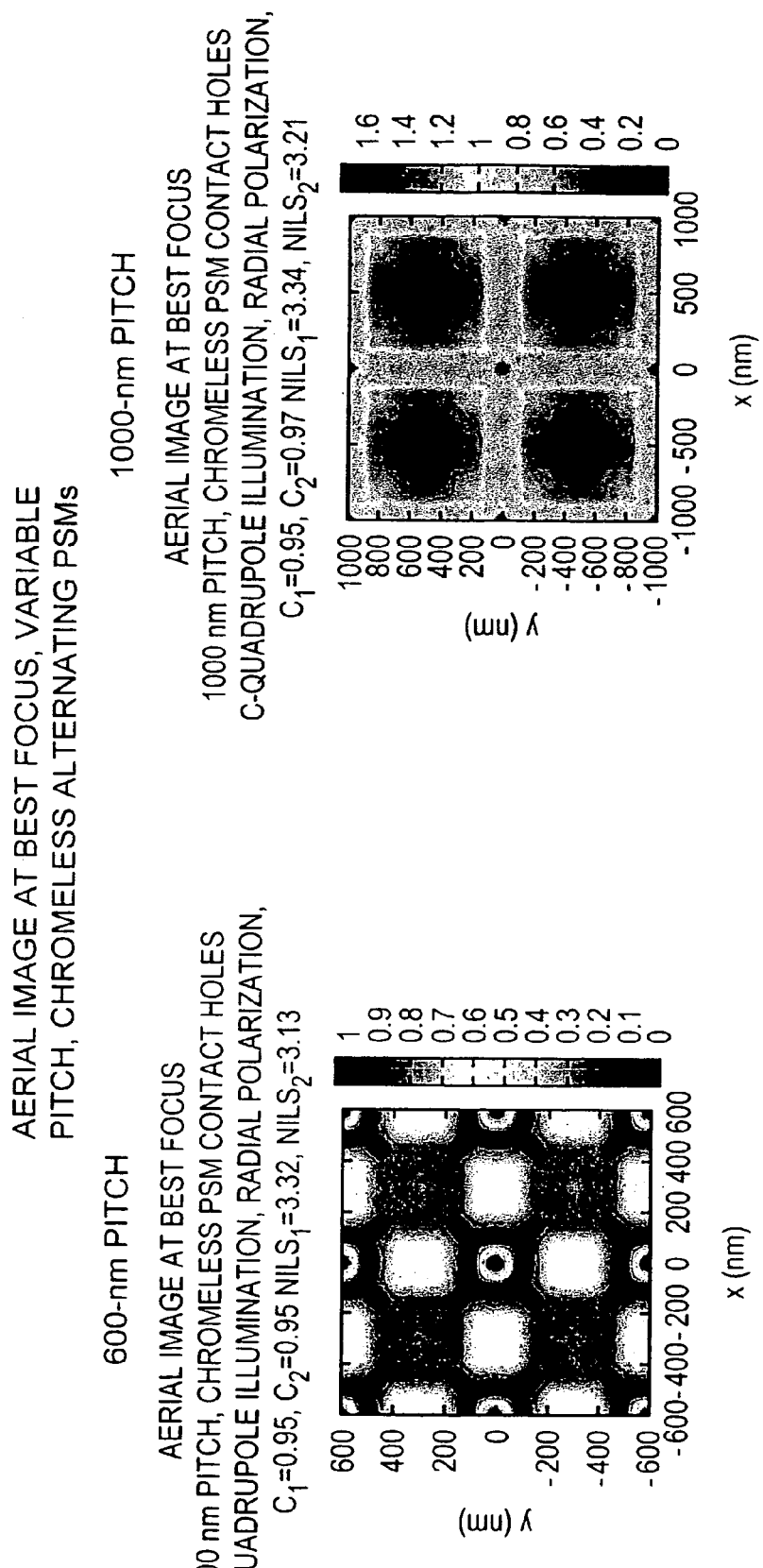

FIG. 19 shows six aerial images at best focus vs. pitch using chromeless alternating PSMs and radially polarized light with C-quad.

Figure 20A:
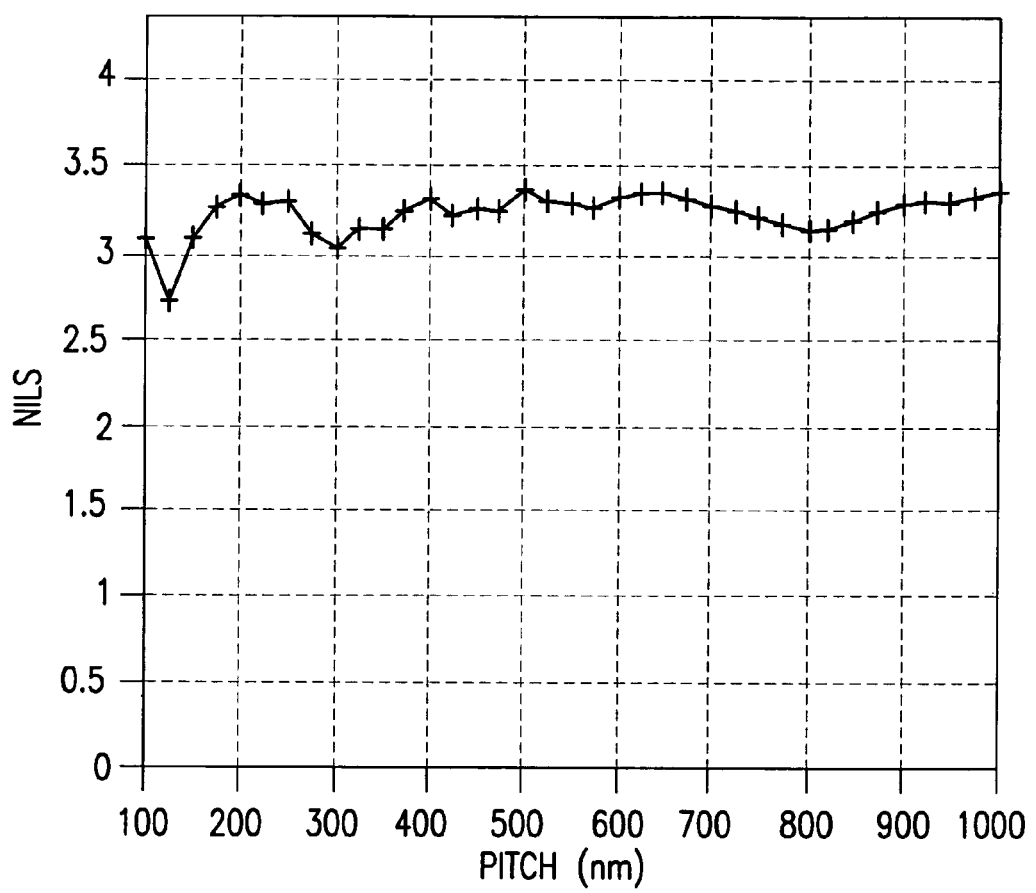
Figure 20B:
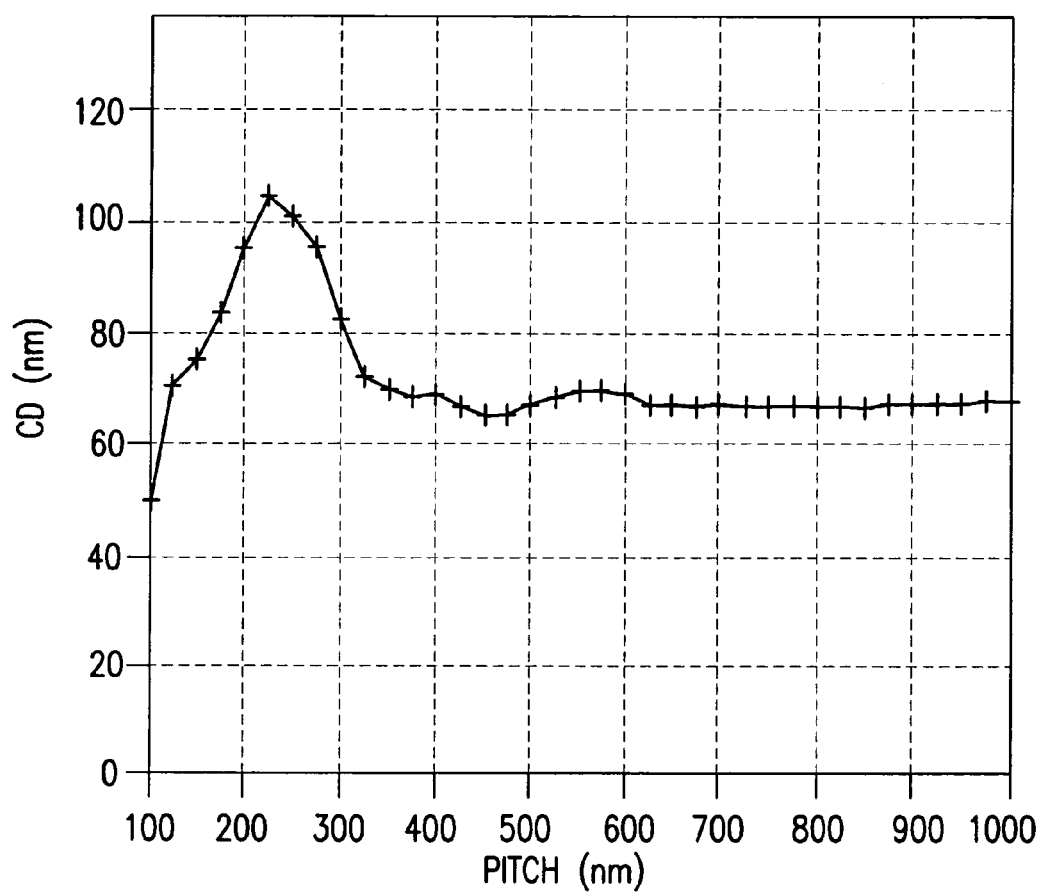

FIGS. 20A and 20B are graphs that show aerial image characteristics versus pitch.

Figure 21A:
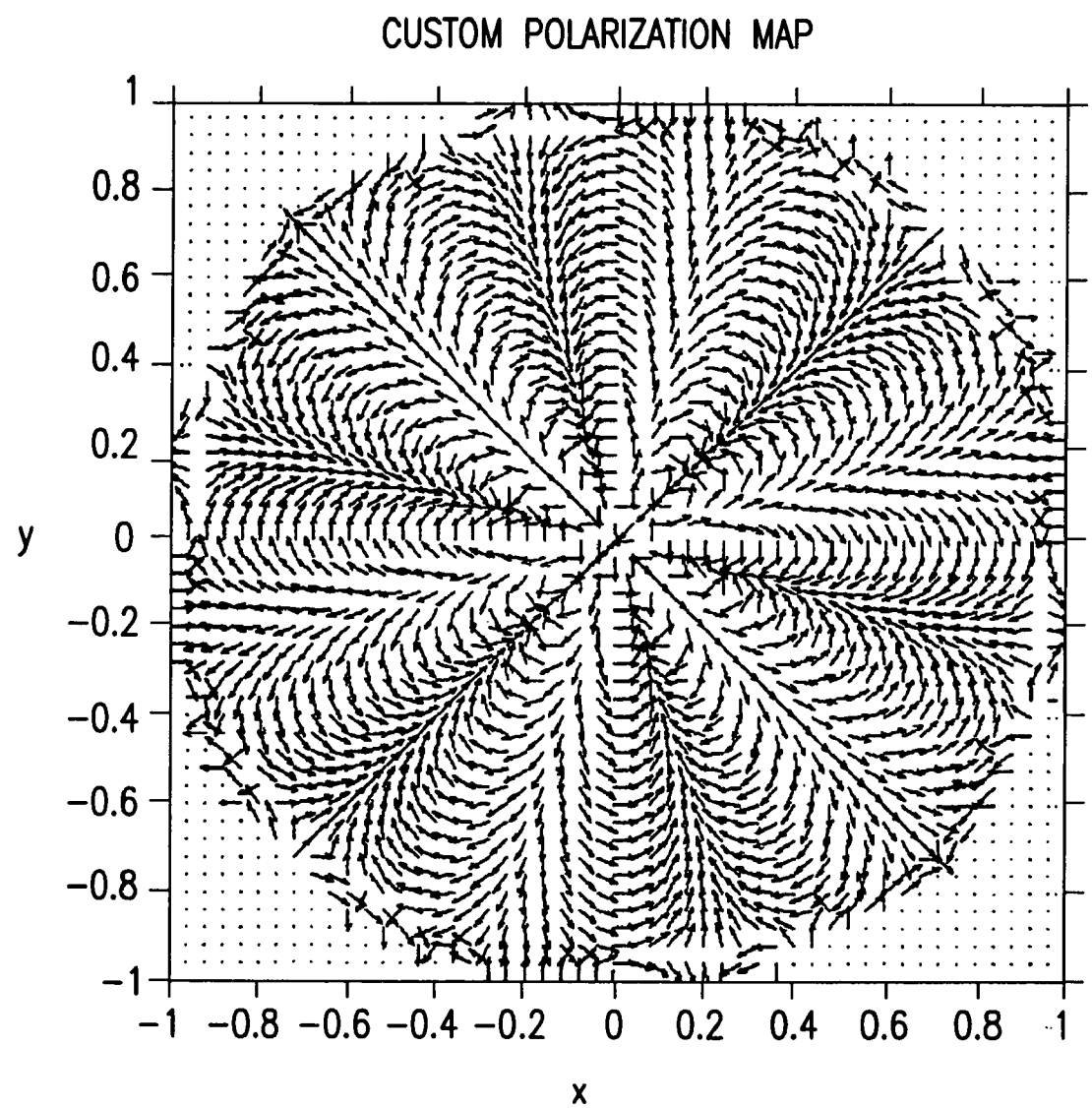
Figure 21B:
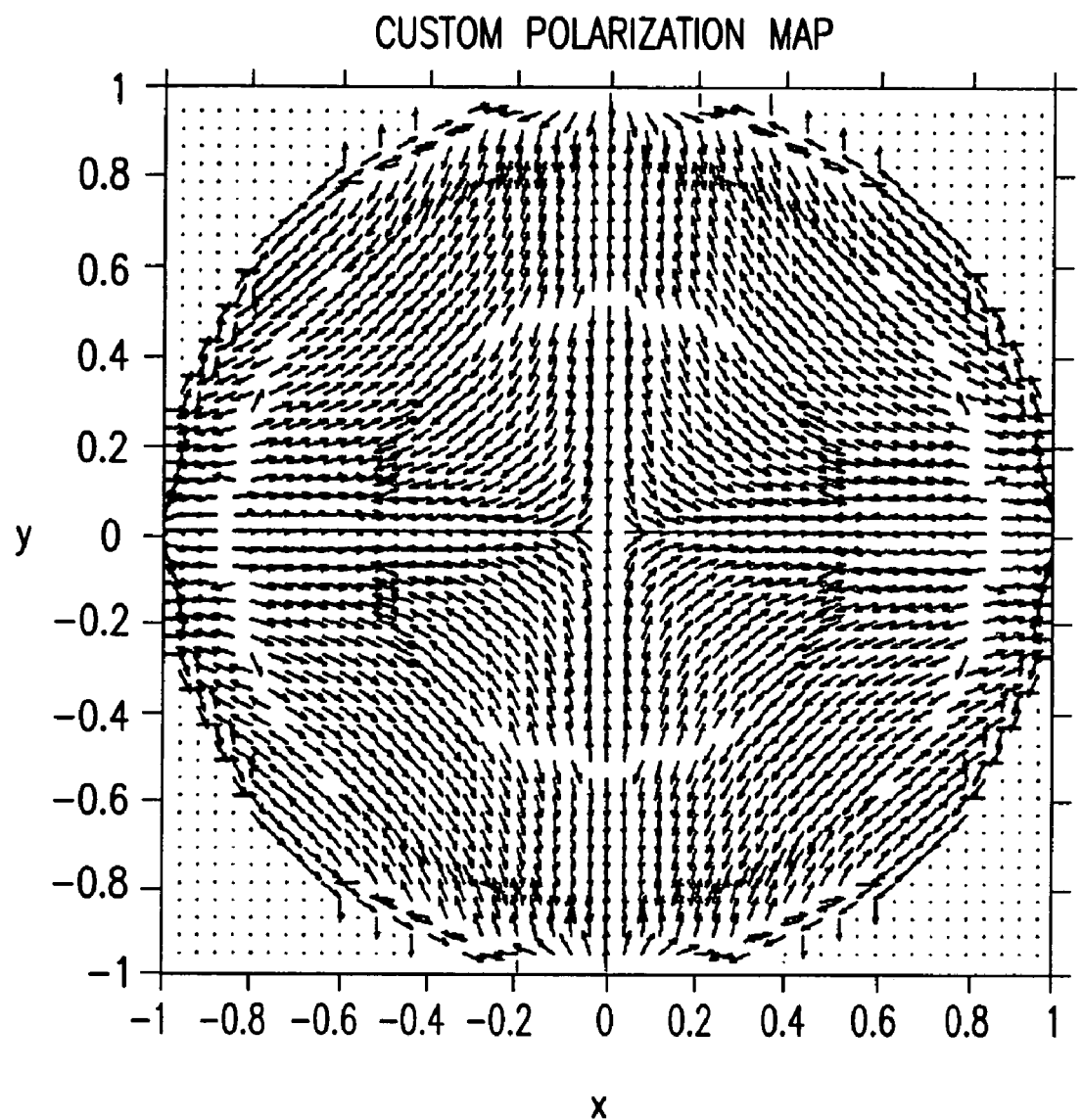

FIGS. 21A and 21B are example custom polarization maps.

Figure 22:
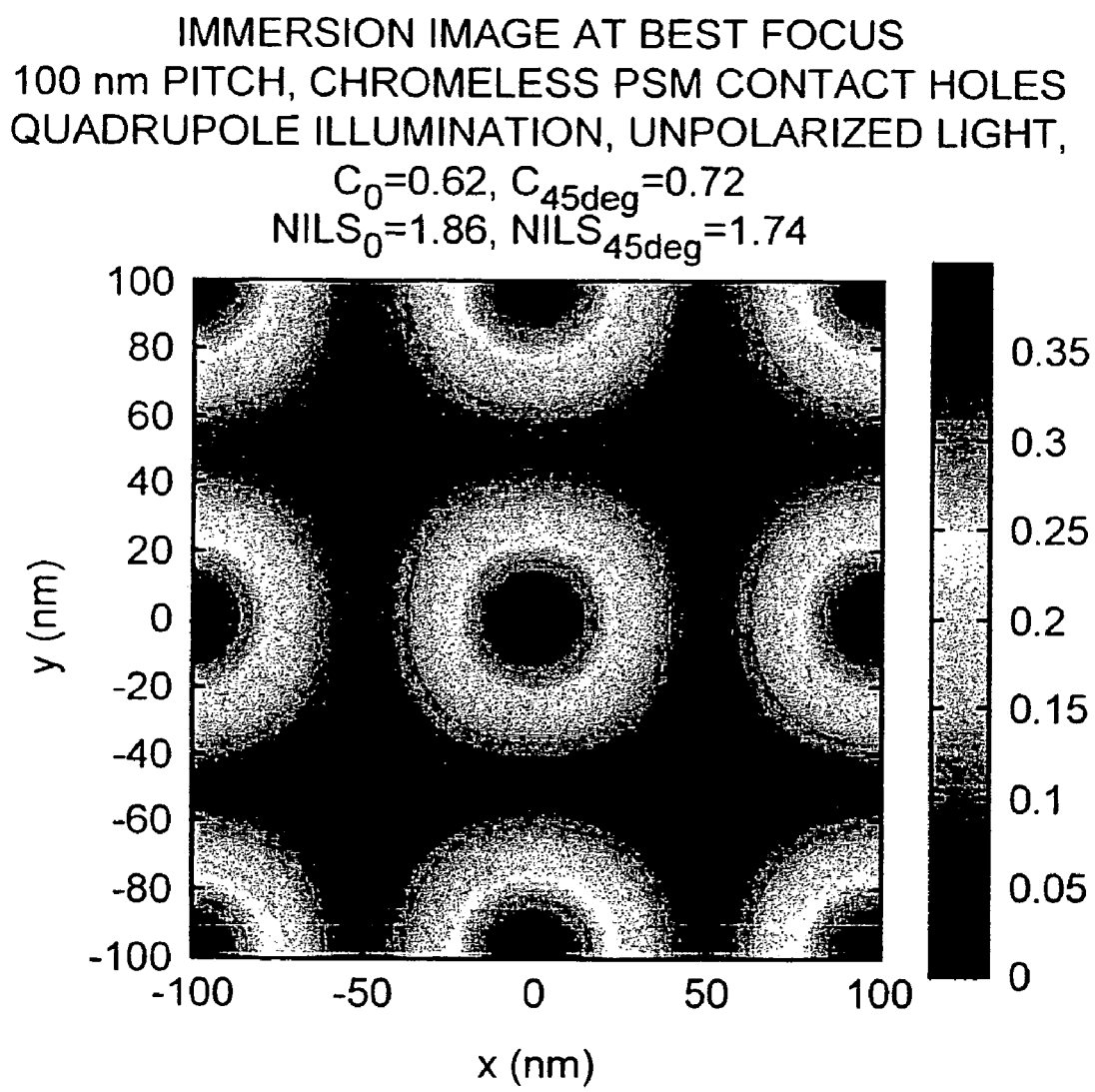

FIG. 22 is an immersion image in the case of unpolarized light with diagonal quadrupole and 6% attenuating PSM at n=1.5.

Figure 23:
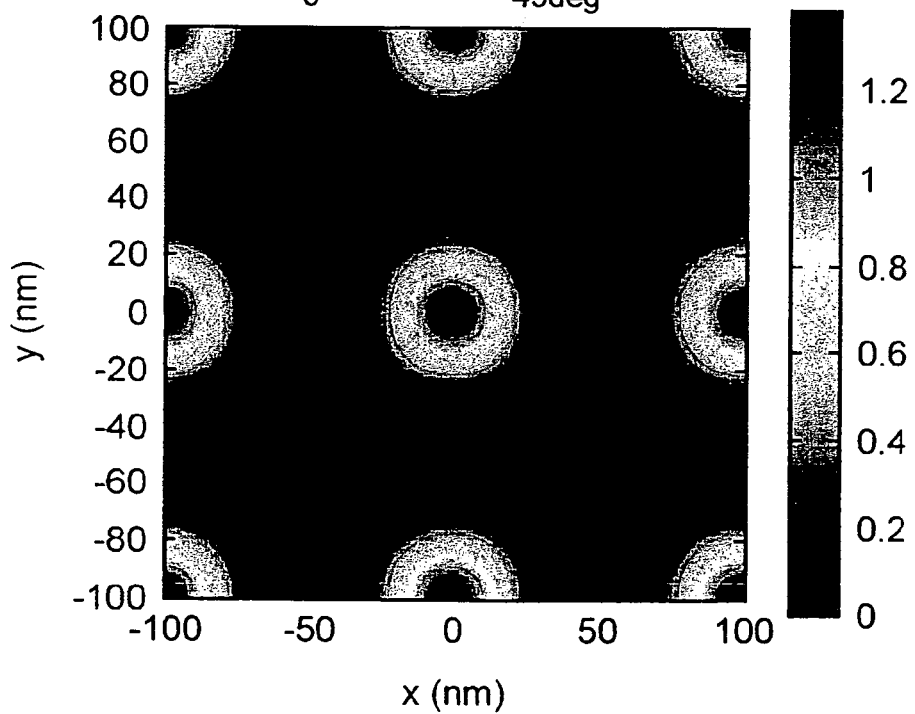

FIG. 23 is an aerial image at best focus under extreme ultraviolet radiation (EUV) conditions.

The present invention will be described with reference to the accompanying drawings. The drawing in which an element first appears is typically indicated by the leftmost digit(s) in the corresponding reference number.

DETAILED DESCRIPTION OF THE INVENTION

Table of Contents
1. Overall System
2. Discussion and Simulation Results
   A. Introduction
   B. Resolution
   B.1. Theoretical resolution limits
   B.2. Resolution capability with off-axis illumination lithography
   C. Polarization
   C.1. Simulation Experiment
   C.2. Effect of Polarization on Image Quality
   C.3. Polarized light, Chromeless PSM, Negative photoresist
   C.4. Radially polarized light, attenuating phase-shift masks or binary masks, and positive photoresists
   D. Polarization With Chromeless Alternating PSM
   D.1. Chromeless Alternating PSM In Conjunction With Radially Polarized Light, 100-nm Pitch Nested Contacts
   D.2. Through-Pitch Behavior, Chromeless Contacts With Radially Polarized Light
   D.3. Custom Polarization
   E. Immersion Lithography
   F. EUV While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

The present invention provides systems and methods for improved lithographic printing with polarized light.

1. Overall System

Figure 1:
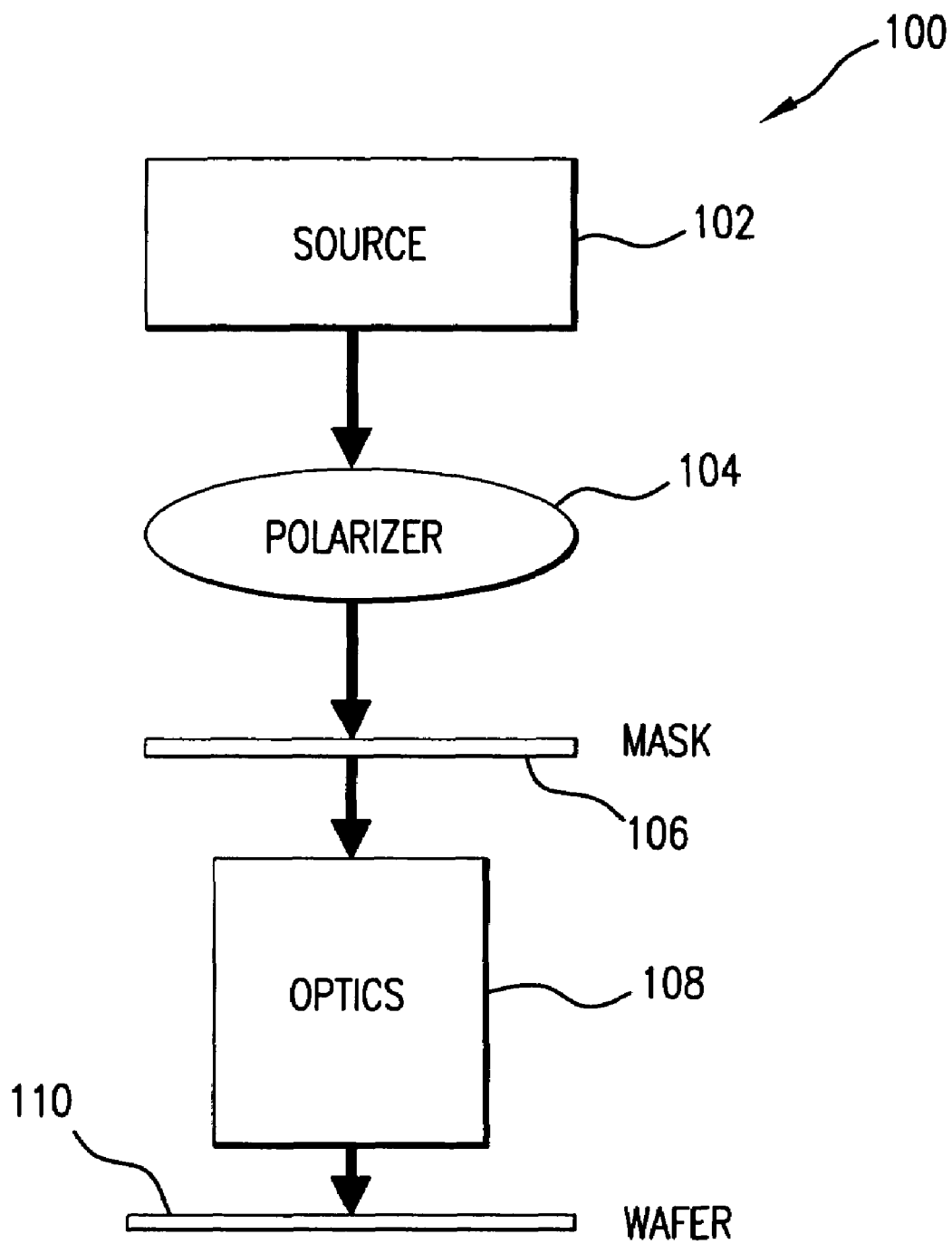
FIG. 1 is a lithography system according to an embodiment of the present invention.

FIG. 1 is a lithography system 100 according to an embodiment of the present invention. System 100 includes an illumination source 102. In an embodiment, illumination source 102 emits pre-polarized illumination light along an optical path. Although the present invention is described herein with reference to pre-polarized illumination light, one of skill in the art will recognize that unpolarized illumination light may also be used. For example of pre-polarized light, illumination source 102 can be a laser that emits a laser beam with a tendency to be approximately linearly polarized. Alternatively, a polarizer could be added within a laser generator in polarized illumination source 102.

The pre-polarized light then passes through a pattern polarizing device 104. As used herein, pattern polarizing device 104 is defined to encompass any polarizing device including, but not limited to, traditional and custom polarizers and wave plates. If pre-polarized light is emitted by illumination source 102, pattern polarizing device 104 may be any polarizing device such as, for example, one or more of a polarizer or a wave plate. If unpolarized light is emitted by illumination source 102, pattern polarizing device 104 is a polarizer rather than a wave plate.

Pattern polarizing device 104 shapes the pre-polarized illumination light into various predetermined arrangements, such as polarization patterns and intensity patterns. For example, pattern polarizing device 104 may shape the pre-polarized illumination light into radially polarized light, tangentially polarized light, or light with a custom polarization. In an embodiment, the illumination light is quadrupole illumination, such as Cartesian quadrupole (C-quad) illumination. Although quadrupole illumination is used herein as an example, one of skill in the art will recognize that illumination of any source shape may be used.

The illumination light illuminates mask 106. Mask 106 produces a design in the illumination light. One of skill in the art will recognize that mask 106 can be any type of mask or reticle. In an embodiment of the present invention, mask 106 is a binary mask. In other embodiments, mask 106 is a phase-shift mask (PSM), such as, for example, a chromeless PSM, alternating PSM, or attenuating PSM.

The light including the mask design then passes through projection optic 108, which further conditions and processes the light. Projection optic 108 may include one element or a plurality of optical elements. Projection optic 108 produces an exposure beam that continues along the optical path.

Finally, the exposure beam exposes wafer 110 according to the design carried by the exposure beam. In embodiments of the present invention, wafer 110 is covered by a negative photoresist layer. In one example embodiment, radially polarized light is used in conjunction with chromeless PSMs, C-quad illumination and negative photoresists. A very high image quality is obtained even when printing contact holes at various pitches in low k applications. Forbidden pitch is avoided.

In other embodiments of the present invention, wafer 110 is covered by a positive photoresist layer. For example, radially polarized light is used in an embodiment to illuminate mask 106 and produce an exposure beam. A positive photoresist layer is then exposed by light in the exposure beam. In another embodiment, radially polarized light is used in conjunction with attenuating phase-shift masks or binary masks, standard diagonal quadrupole illumination and positive photoresists. A very high image quality is obtained even when printing contact holes at various pitches in low k applications.

Figure 2:
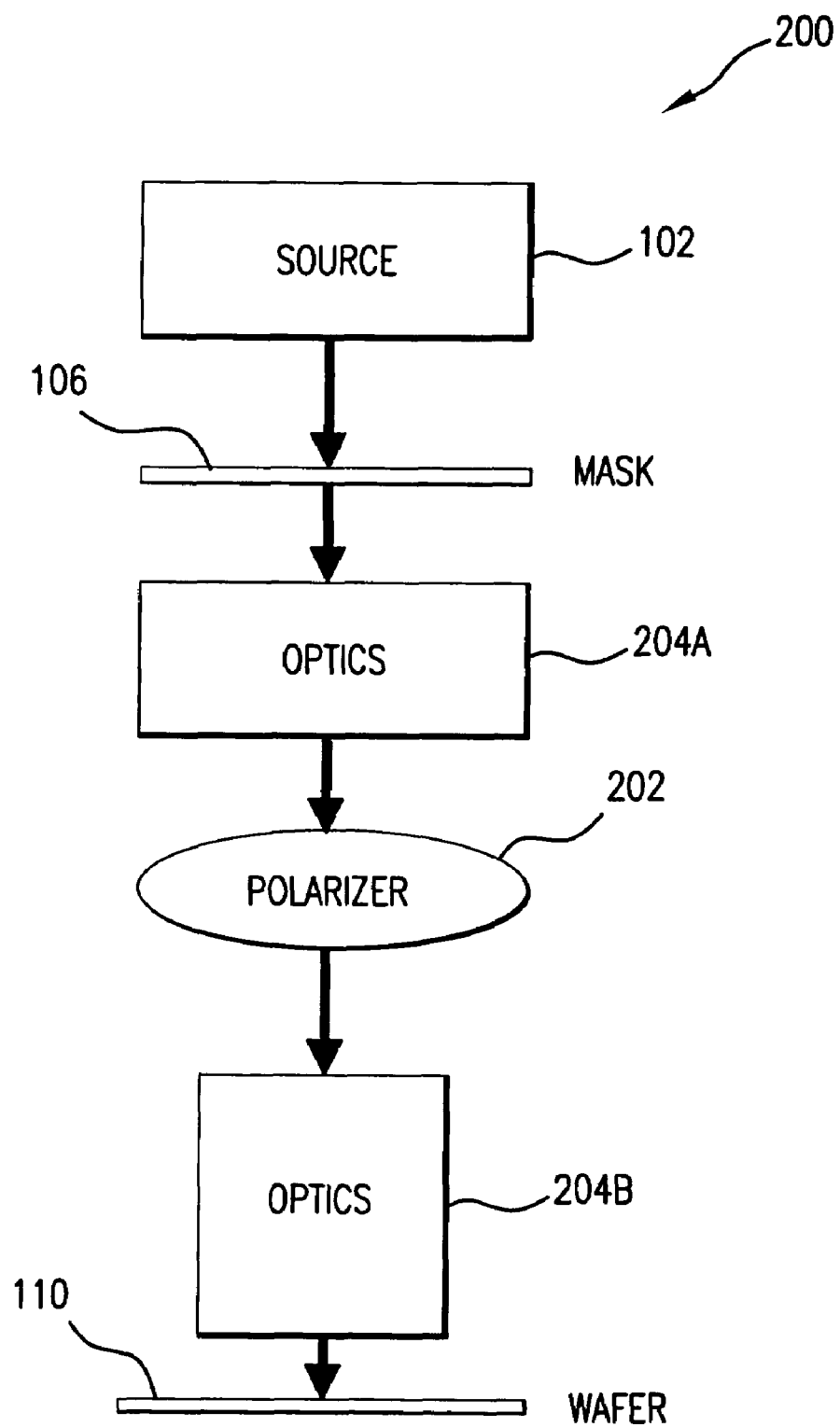
FIG. 2 is a lithography system according to an embodiment of the present invention.

FIG. 2 is another example lithography system 200 in which the present invention can be implemented. Polarized illumination source 102 and mask 106 perform the same functions as described with respect to system 100. In system 200, however, a pattern polarizing device 202 is included in projection optic. As with pattern polarizing device 104, pattern polarizing device 202 shapes the pre-polarized illumination light into various predetermined arrangements, such as a radial polarization arrangement, a tangential polarization arrangement, or a custom polarization arrangement. Optical components for further shaping and conditioning the illumination light may be placed before and/or after pattern polarizing device 202. These optical components are shown as projection optic 204A and projection optic 204B, and create an exposure beam that continues along the optical path.

After being shaped by pattern polarizing device 202 and projection optics 204A and/or 204B, the polarized light exposes wafer 110 according to the design produced by mask 106. As stated with respect to FIG. 1, wafer 110 may be covered with either a positive or negative photoresist layer.

2. Discussion and Simulation Results

The following discussion and simulation results is provided to further illustrate aspects and features of embodiments of the present invention, and is not intended to limit the present invention. The inventors compared several approaches to printing 50/50-nm nested contact holes using the Prolith™ 7.1 lithography simulation system available from KLA-Tencor Corp. The approaches used include: off-axis quadrupole illumination and attenuating phase-shift mask with optimized polarization of the illumination; chromeless alternating phase shift-masks (CAPSM) in conjunction with special polarization schemes; immersion lithography with extremely high numerical aperture (NA) at 157-nm wavelengths; and EUV lithography.

The inventors found the limits of the off-axis illumination technique can be pushed with the use of radial polarization and how the mask bias (or background transmission) can be used to optimize the image. Resolution limits are further pushed with 2D chromeless alternating PSM combined with the radial polarization. With radial polarization enhancement according to embodiments of the present invention, high-contrast images can be obtained and high-quality contact holes at 100-nm pitch can be printed using negative photoresist. Radial polarization according to embodiments of the present invention can further enhance image quality in example applications involving immersion. The inventors further compared these findings with results obtained at an extreme ultraviolet radiation (EUV) wavelength to confirm that imaging at an EUV wavelength and low NA can also provide excellent conditions to print 100-nm-pitch contact holes.

A. Introduction

Figure 3B:
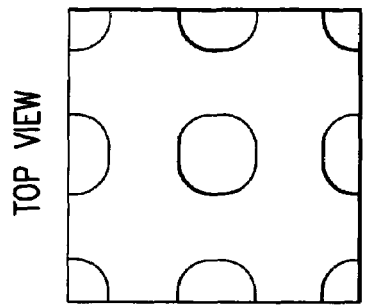
FIG. 3B is a top-view image of contact holes in resist on a wafer.
Figure 3A:
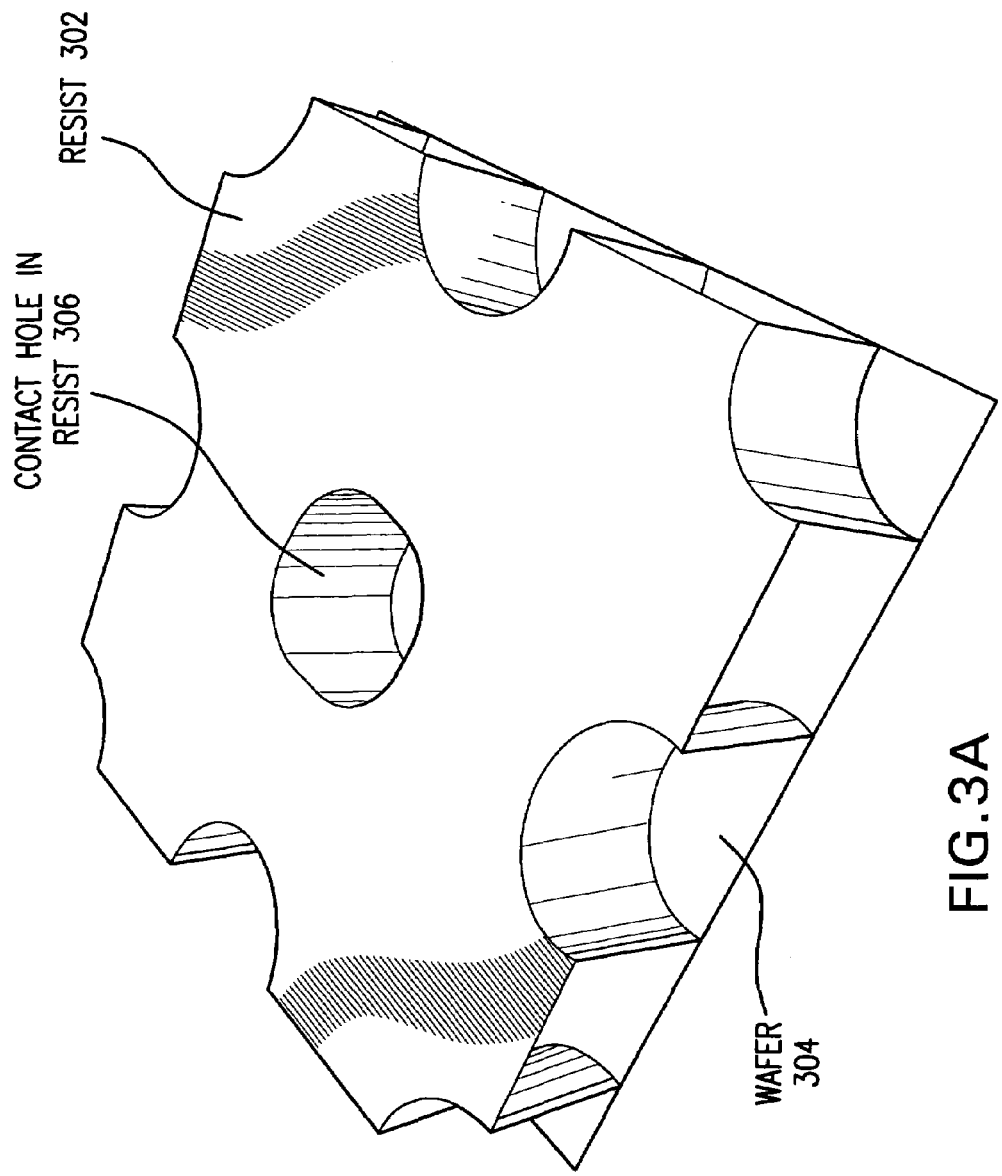
FIG. 3A is a zoomed-in image of contact holes in resist on a wafer.

At present, producing 50-nm contacts with a 100-nm pitch represents a challenge for optical lithography. Industry roadmaps for semiconductor devices require 50 nm contacts to be available by 2008. To achieve this capability before EUV becomes widely available requires a significant extension to current optical lithography. Even with high-NA optics using a 157-nm wavelength, traditional contrast-enhancement techniques such as off-axis illumination and attenuating PSM are not sufficient to print 100-nm-pitch contact holes of a high enough quality. There is a need to use resolution-enhancing techniques in addition to quadrupole illumination with attenuating PSM for the printing of 100-nm-pitch contacts. For reference, FIG. 3A is a zoomed-in diagram of an example wafer with contact holes. Resist layer 302 is attached to wafer surface 304. A lithography system (not shown) exposes resist layer 302 to produce contact hole 306. FIG. 3B is an image of the contact hole pattern when viewed from above.

Simulations were used to examine the optimum printing technique for grouped contacts according to embodiments of the present invention. The inventors used Prolith™ 7.1 to explore techniques to improve contact-window printing capabilities. First, the inventors simulated conventional lithographic conditions for a high numerical aperture 157-nm system and establish the minimum pitch that can be printed with adequate image contrast. Next, the inventors progressively modified the technique to improve resolution capability. In this way, the present inventions demonstrates an improvement in results compared with the starting condition of off-axis illumination and a 6% attenuated phase-shift mask (PSM) by first optimizing the polarization of the illumination, exploring chromeless phase-shift masks, and then by introducing wavelength-shortening methods such as immersion lithography and EUV lithography.

B. Resolution

First, the theory of resolution is examined in the context of printing contacts. This theory helps explains how one can enhance the resolution of system for contact arrays.

B.1. Theoretical Resolution Limits

For a 2D periodic pattern of pitch $p_x$ in the x direction and $p_y$ in y direction, the mask spectrum is non zero at discrete spatial frequencies whose x and y components are inversely proportional to the pitch:

$$(f_x, f_y) = \left(\frac{n}{p_x}, \frac{m}{p_y}\right)$$

where n and m are integer numbers (0, +/−1, +/−2, +/−3 etc.)

Often, it is more convenient to work with normalized spatial frequencies i.e.:

$$(\hat{f}_x, \hat{f}_y) = \left(\frac{n \cdot \lambda}{p_x \cdot NA}, \frac{m \cdot \lambda}{p_y \cdot NA}\right)$$

At a minimum, in addition to the zero order, the first three diffraction orders must be captured by the lens to ensure sufficient resolution, i.e., the (0,0), (0,1), (1,0) and (1,1) orders.

Figure 4A:
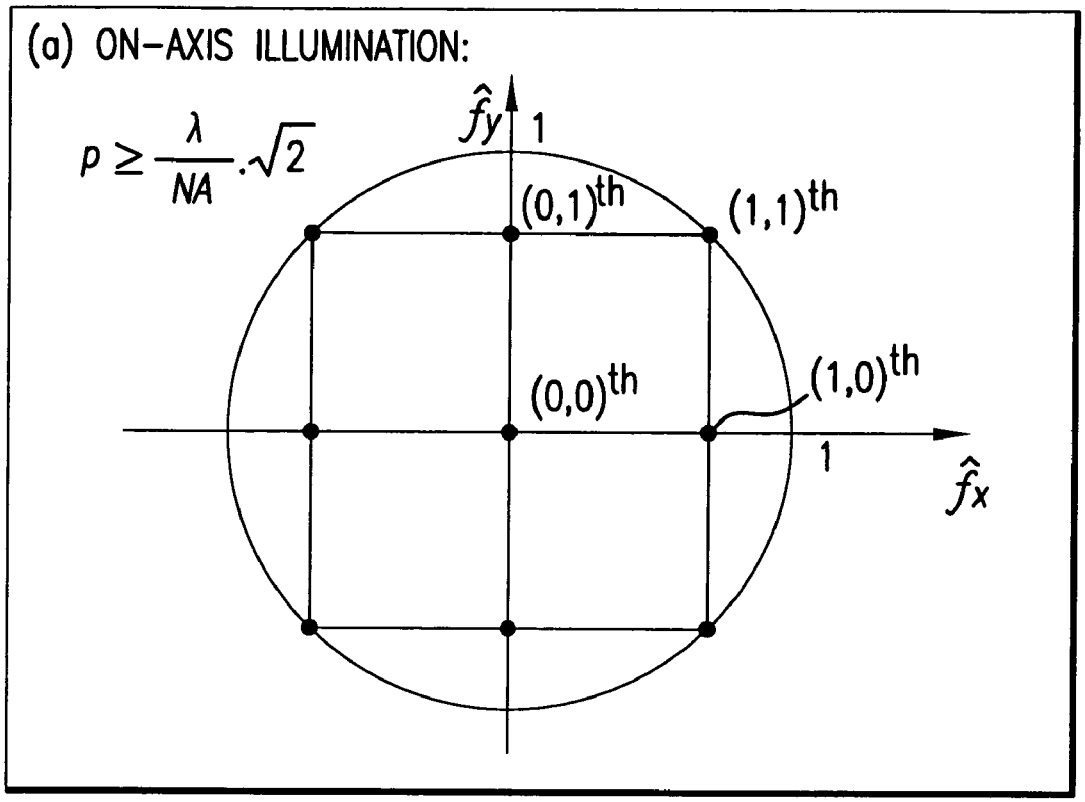
FIGS. 4A and 4B illustrate 2D attenuating PSM mask spectra, $p_x = P_y = p$ with on-axis and off-axis illumination respectively according to an embodiment of the present invention.

For on-axis illumination, this requirement is equivalent to:

$$\sqrt{\hat{f}_x^2 + \hat{f}_y^2} \leq 1$$

i.e., fitting a square into one quadrant of a unit radius circle (see, diffraction pattern in FIG. 4A)

i.e.

$$p \geq \frac{\lambda}{NA} \cdot \sqrt{2}$$

if

Figure 4B:
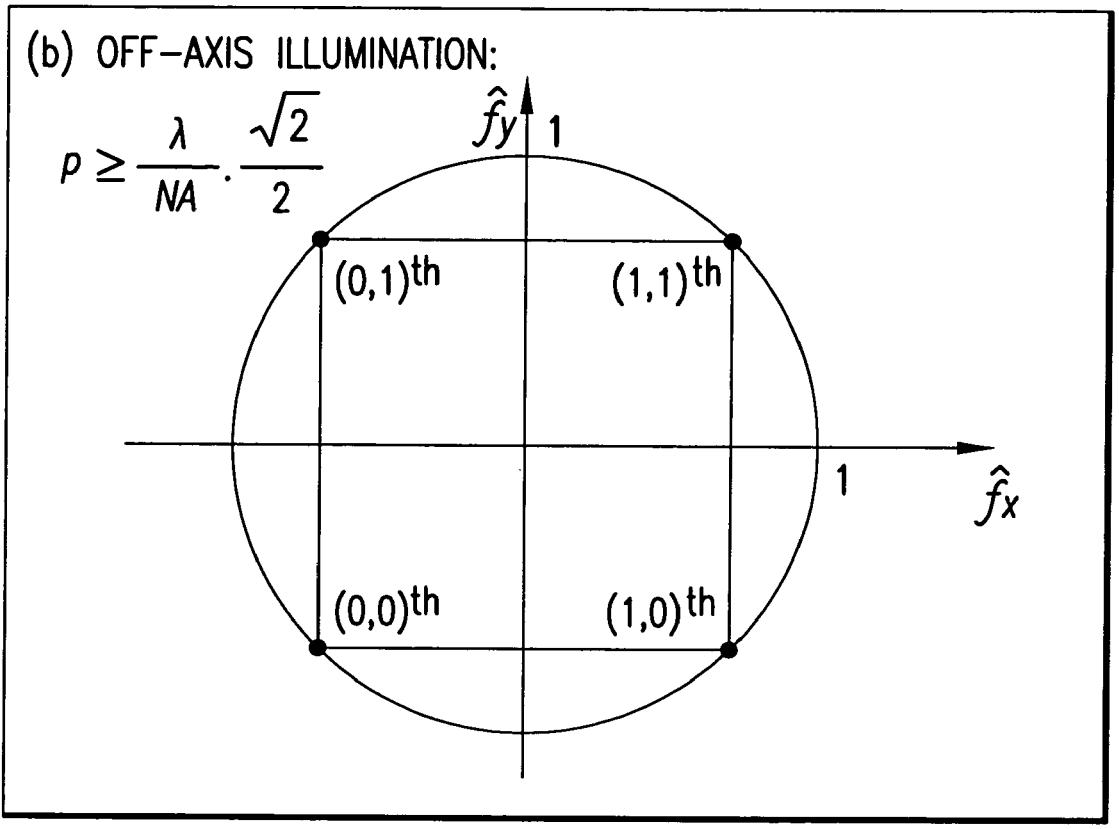

-continued $$p_x = p_y = p,$$

and with diagonal off-axis illumination:

$$\sqrt{f_x^2 + f_y^2} \leq 2$$

i.e., fitting a square into the entire unit radius circle (see diffraction pattern in FIG. 4B), i.e.

$$p \geq \frac{\lambda}{NA} \cdot \frac{\sqrt{2}}{2}$$

if $$p_x = p_y = p.$$

By using this theory, one can establish that at 157-nm wavelength and 0.93 NA, and for grouped contact holes, the theoretical minimum pitch (in x and y directions) that can be imaged is therefore 240 nm with on-axis illumination and 120 nm with off-axis illumination. The inventors ran simulations to further explore the off-axis case.

B.2. Resolution Capability with Off-Axis Illumination Lithography

Resolution can be improved by going from conventional on-axis illumination to off-axis illumination. Being able to produce an image is, by itself, insufficient to meet certain quality criteria to ensure sufficient process latitude in resist. To print nested contact holes, assume that contrast and normalized image log slope (NILS) must be greater than 0.5 and 1.5, respectively. See, Graeupner, P., et al., "Solutions for printing sub-100 nm contact with ArF," *SPIE* 4691:503 (2002).

With these requirements, the inventors determined the smallest pitch at which nested contact holes can be printed in this example. First, example high-quality conditions for printing low-k, grouped contact holes were considered. These conditions include:

0.9/0.1 Quadrupole illumination with diagonal poles (where 0.9 is the distance of the poles from the center and 0.1 is the pole radius)

0.93 NA

6% 1:1 Attenuating PSM

Unpolarized light incident on the reticle

By gradually decreasing the pitch, the aerial image contrast in the pitch direction (C0) can stay above 0.5 as long as the pattern pitch is 134 nm (i.e. 67-nm contacts and spaces). This coincides with a NILS of ~1.5. The resulting image is shown in FIG. 5.

The printing resolution pitch of contacts can be improved from 240 nm to 134 nm by changing from on-axis illumination to off-axis illumination. Clearly, the smallest resolvable pitch as defined above will change somewhat when using a slightly different NA or quadrupole. This definition does not take into account depth of focus (DOF); therefore, the lowest printable pitch is expected to be larger. This example is sufficient to show that fairly unconventional means must be used to push the resolution limit down to 100-nm pitch.

C. Polarization

There are references in the literature to "polarization matching" in which the electric field vectors overlap and result in maximum interference and consequently in maximum image quality. See, Ma, Z., et al., "Impact of illumination coherence and polarization on the imaging of attenuated phase shift masks," *SPIE* 4346:1522 (2001). Linearly polarized illumination has been used to improve image quality for lines of appropriate orientation, but no specific polarization schemes have been suggested for contact holes as in embodiments of the present invention.

In the following discussion, the effects of using radially and tangentially polarized light are revealed. These two types of polarization enhance image quality for contact holes. Although radial and tangential polarizations are discussed here, one of skill in the art will recognize with this disclosure that other polarizations, including custom polarizations, can also be used to enhance image quality.

Unless stated otherwise in the following, the NA is 0.93, the illumination is 0.9/0.1 diagonal quadrupole, and the wavelength is 157.6 nm.

C.1. Simulation Experiment

The Prolith™ 7.1 simulator used for this work offered a choice of three polarization modes, namely, x polarized, y polarized, and unpolarized light. The image for the unpolarized mode was obtained by adding the aerial images of the x polarized and y polarized modes.

Figure 6:
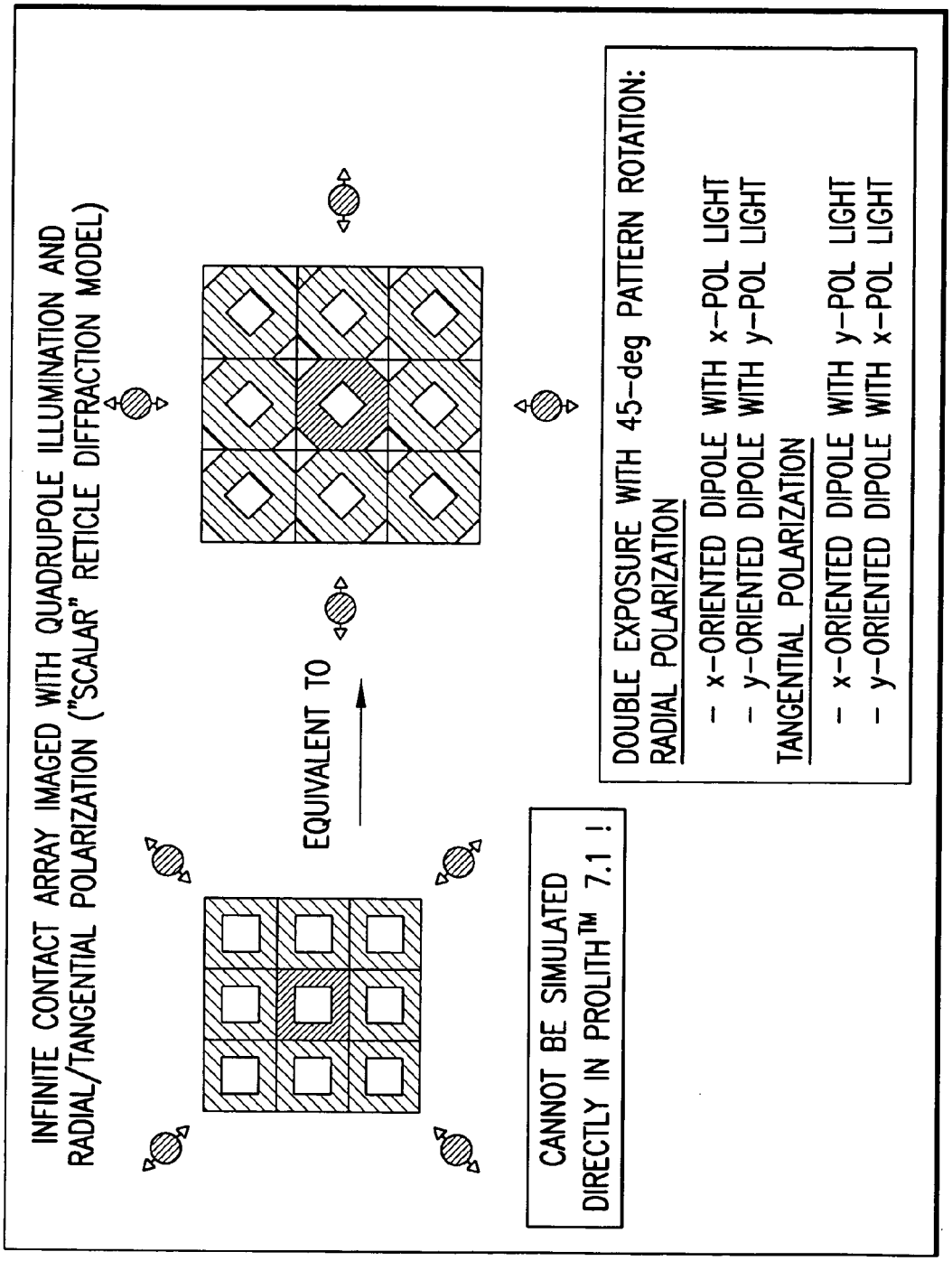
FIG. 6 is an illustration of an example simulation experiment (radially polarized light is shown for illustration).

To simulate tangentially or radially polarized light, a simple manipulation of the mask orientation was carried out using Prolith™ 7.1. An example of the orientation manipulation is illustrated in FIG. 6. Assuming the poles to be sufficiently small, the inventors first rotated the pattern by 45°. They then calculated a first image using x-oriented dipole illumination with x or y polarized light (x polarization for radial and y polarization for tangential). Next, a second image was calculated using y-oriented dipole illumination with x or y polarized light (y polarization for tangential and x polarization for radial). Finally, the two images were added to obtain the final image.

C.2. Effect of Polarization on Image Quality

Figure 7A:
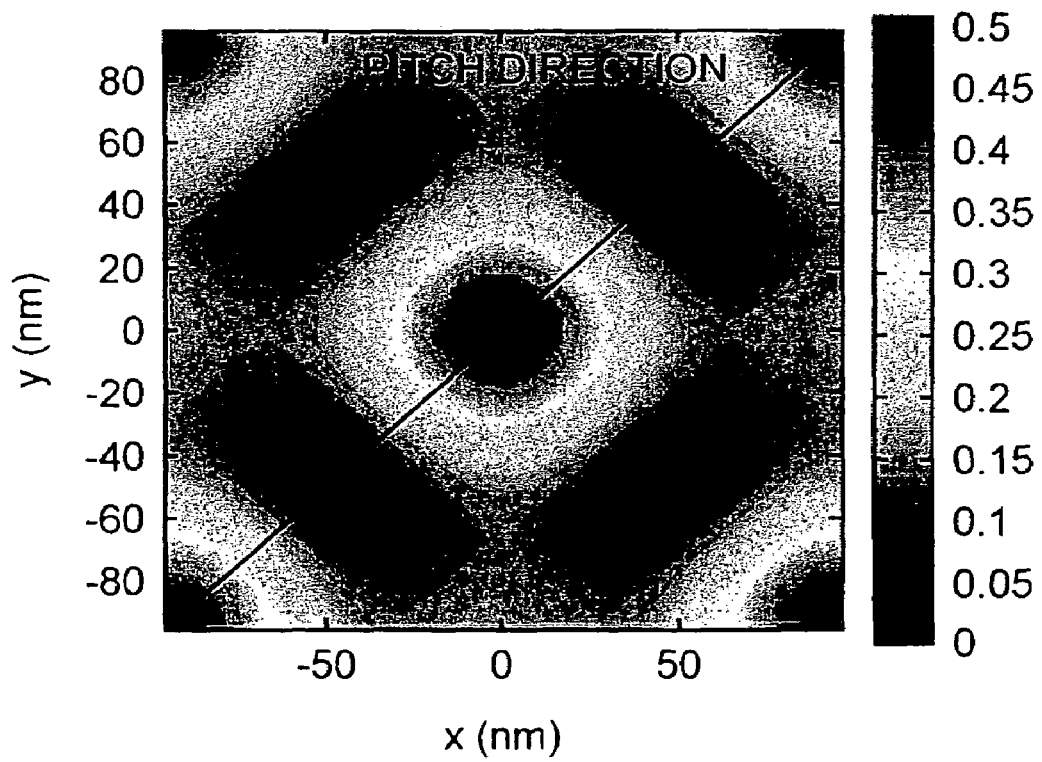
FIGS. 7A and 7B show effects of radial and tangential polarization on image quality.
Figure 7B:
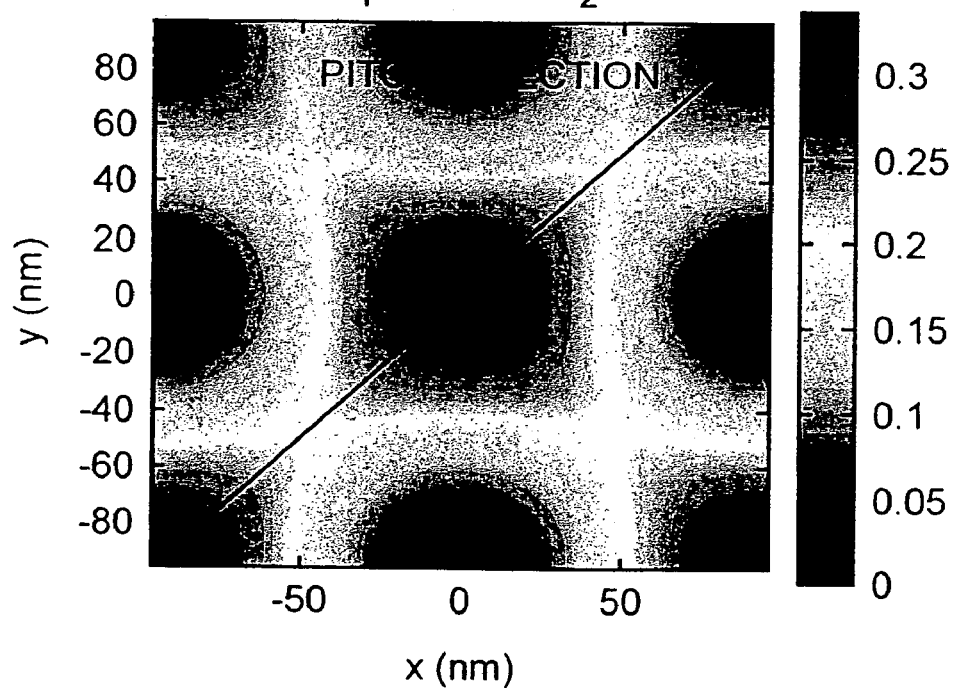

For comparison, FIGS. 7A and 7B show images using radial and tangential polarization, respectively, according to the present invention. The difference between tangential polarization and radial polarization is illustrated in FIGS. 10A and 10B. When light is unpolarized, as shown in view 1002, the directions of the polarization vectors vary randomly. Once the unpolarized light passes through tangential polarizer 1004, however, the light becomes tangentially polarized, as shown in view 1006. Once they are tangentially polarized, the polarization vectors uniformly circle around a central location.

Radial polarization acts somewhat differently. As illustrated in FIG. 10B, when unpolarized light 1002 passes through radial polarizer 1008, the light becomes radially polarized light 1010. Once radially polarized, the polarization vectors emanate uniformly from the central location.

The pitch direction is shown as a diagonal line on FIGS. 7A and 7B.

The contrast along the pitch direction is very high, i.e., 0.88 with radial polarization, while it is very low (0.19) with tangential polarization. At 45 degrees from the pitch direction, contrast is high for both types of polarization.

With radially polarized light, the image can be optimized by changing the contact-hole width (i.e., the mask bias) until the contrast is the same in both the orthogonal and the diagonal directions (with tangential polarization, no such improvement was observed). A contact-hole width of 85 nm (i.e., 18-nm mask bias) produced uniform contrast at a pitch of 134 nm (approximately equal diagonal and orthogonal contrasts), in one preferred example.

Alternatively, it is possible to modify the background transmittance of the mask to obtain the same effect. The inventors found that radially polarized light results in an image quality that is superior to that produced with unpolarized light, even when out of focus.

Figure 8A:
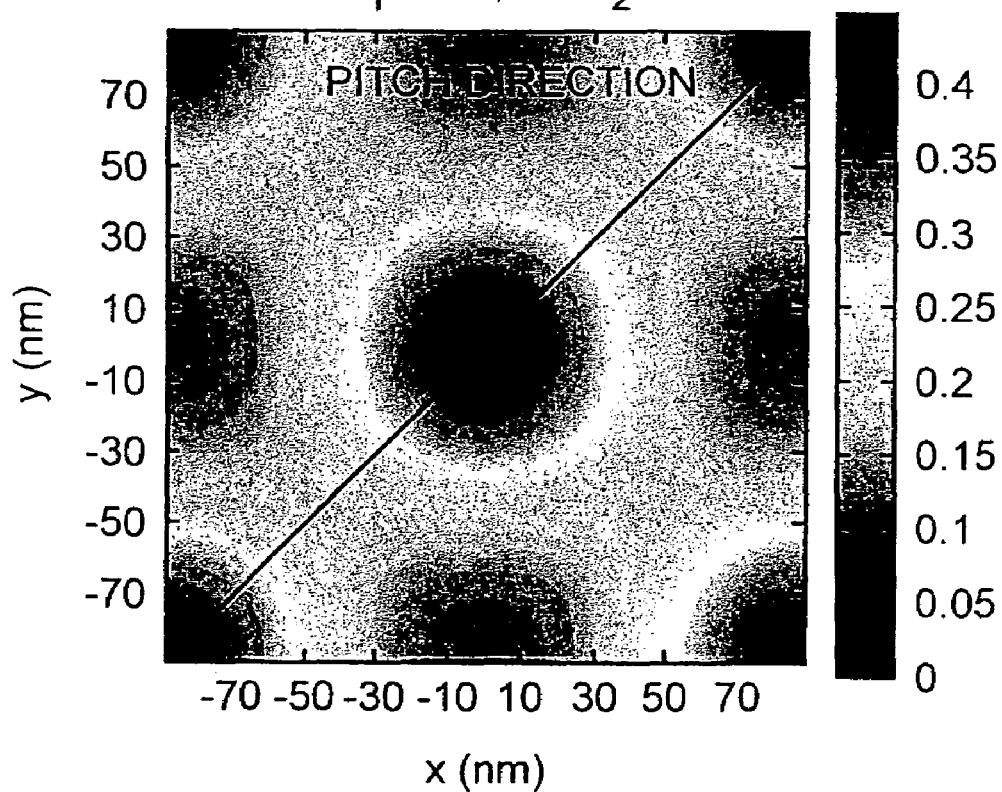
FIGS. 8A-8C show a comparison of three polarization modes in an example of 125-nm pitch (45-degree-rotated masks).
Figure 8B:
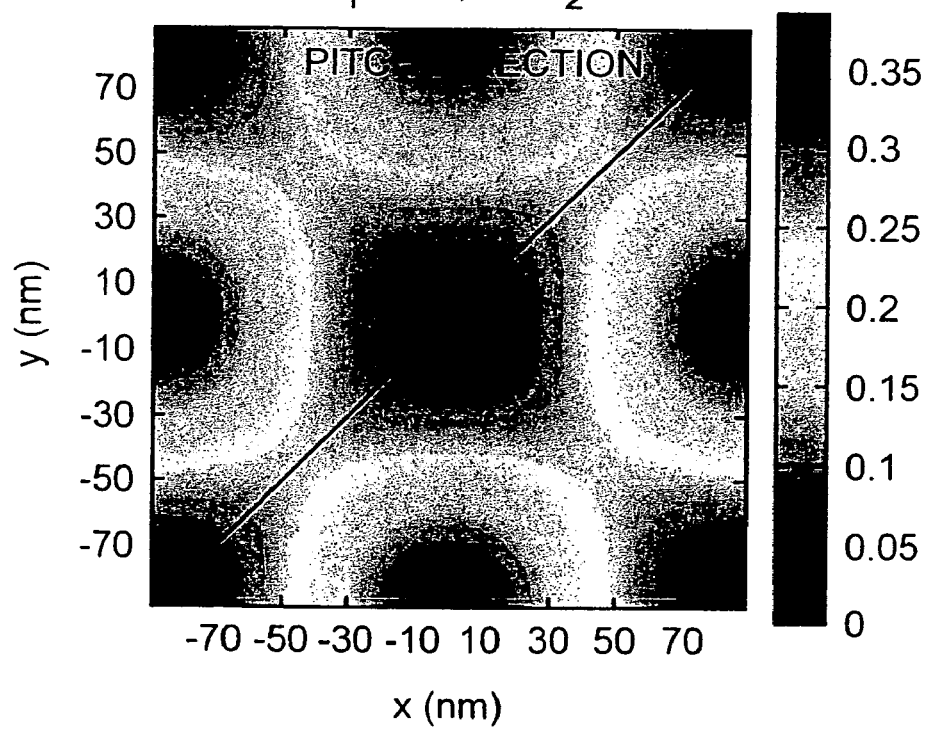
Figure 8C:
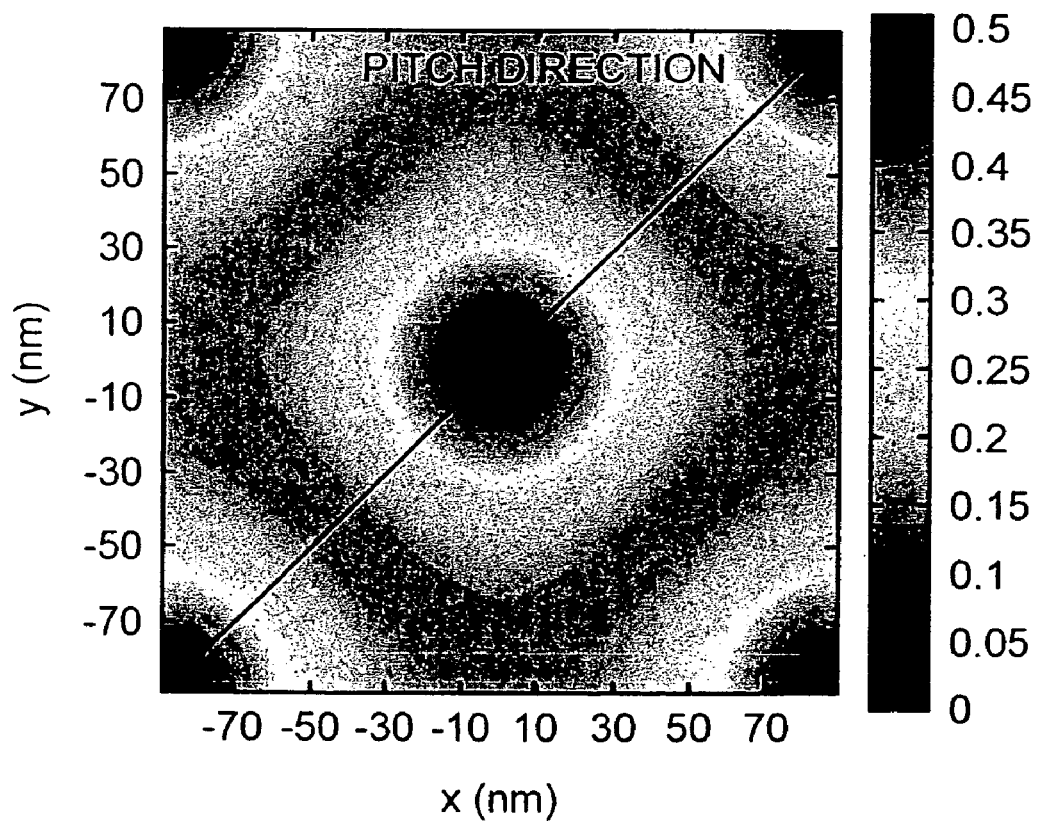

The improved resolution afforded by the optimization of illumination polarization was examined. The minimum pitch can be reduced to 125 nm, and an optimum contact-hole width found. With radial polarization, intense side lobes can be observed at small contact-hole widths. The side lobes disappear as the contact-hole width is gradually increased from 50 nm to 75 nm. This is followed by a more uniformly distributed contrast around the contact. The results indicated that the radially polarized case offers more than 30% NILS improvement over the unpolarized light case. FIGS. 8A-8C illustrate the comparison of the three polarization states according to the present invention. In each of these figures, the pitch direction is shown. FIG. 8A is an aerial image using unpolarized quadrupole illumination at 75 nm contact width. FIG. 8B is an aerial image with 75 nm contact width using tangentially polarized quadrupole illumination. Finally, FIG. 8C is an aerial image, again at 75 nm contact width, using radial quadrupole illumination.

Polarizing the illumination can improve the resolution limit from 134 nm down to 125 nm. These figures are based on the use of radially polarized light and a minimum contrast requirement of 0.5 (NILS requirement of 1.5).

C.3. Polarized Light, Chromeless PSM, Negative Photo-Resist

In embodiments of the present invention, polarized light (radially or tangentially polarized) is used to illuminate a phase-shift mask (PSM) and produce an exposure beam. A negative photoresist layer is then exposed by light in the exposure beam. A chromeless PSM can be used. In one example embodiment, radially polarized light is used in conjunction with chromeless PSMs, Cartesian quadrupole (C-quad) illumination and negative photoresists. A very high image quality is obtained even when printing grouped or nested contact holes in low k applications. Forbidden pitch is avoided.

In one example, radially polarized light is used in conjunction with chromeless PSMs, Cartesian quadrupole illumination, and negative photo-resists to push the resolution to k=0.29. The present invention is not limited to Cartesian quadrupole illumination. Further examples include but are not limited to quasar illumination, illumination having four-fold symmetry, or any other illumination approximating quadrupole illumination. According to simulations performed by the inventors on the PROLITH™ 7.1 system, near perfect contrast of image occur when negative photo-resist and radially polarized illumination are used.

FIGS. 9A-9C show the effect of polarization on image quality in the simulation results obtained by the inventors. The results shown in FIGS. 9A-9C are simulations of 100 nm pitch, chromeless PSM contact holes using a 157 nm wavelength, 0.93 NA and a resist with a refractive index of 1.78.

FIG. 9A shows a poor contrast image of contact holes obtained in a case using unpolarized light and quadrupole illumination. FIG. 9B shows a poor contrast image of contact holes obtained in a case using tangentially polarized light and quadrupole illumination. FIG. 9C shows a high contrast image of contact holes obtained in a case using radially polarized light and quadrupole illumination according to an embodiment of the present invention.

The minimum contrast of the three types of polarization in this example is summarized below:

| Polarization state | Minimum contrast |
|---|---|
| Unpolarized | 0.67 |
| Tangential | 0.44 |
| Radial | 1.0 |

In addition, this technique has the potential to be used at even lower k-factor (e.g., where k equals 0.26 with contrast larger than 0.75)

This approach shows no forbidden pitch as demonstrated in FIGS. 11A and 11B. FIGS. 11A and 11B are graphs that respectively plot the CD (in nm) and NILS over a range of pitches between 100 and 900 nm, according to the present invention. FIGS. 11A and 11B show that NILS does not drop below 2.9 for all simulated pitches (100 to 900 nm in 25 nm pitch steps) indicating that all pitches can be printed simultaneously with good exposure latitude.

C.4. Radially Polarized Light, Attenuating Phase-Shift Masks or Binary Masks, and Positive Photoresists In further embodiments of the present invention, radially polarized light is used to illuminate a phase-shift mask (PSM) and produce an exposure beam. A positive photoresist layer is then exposed by light in the exposure beam. The mask can be an attenuating PSM or binary mask.

An example of an attenuating PSM 1200 is shown in FIG. 12. For ease of explanation, only cell 1202 of attenuating PSM 1200 is described. Central section 1204 of cell 1202 is an area of 100% transmission, meaning that all light of a certain phase passes through. For example, central section 1204 may transmit all light having a phase of 0°. Outer section 1204 of cell 1202 causes the attenuation, in that a lower percent of light of another phase is transmitted. For example, as shown in FIG. 12, outer section 1206 only allows 6% of light at a phase of 180° to pass through.

Alternatively, a binary PSM may be used in the present invention. FIG. 13 illustrates an example binary PSM 1300. For ease of explanation, only cell 1302 of binary PSM 1300 is described. Much like central section 1204 of attenuating PSM 1200, central section 1304 of binary PSM 1300 allows 100% of light through. However, instead of allowing an attenuated degree of light to pass, outer section 1306 prevents all light from passing through. In other words, outer section 1306 has a 0% transmission rate.

In one example embodiment, radially polarized light is used in conjunction with attenuating phase-shift masks or binary masks, standard diagonal quadrupole illumination and positive photoresists. A very high image quality is obtained even when printing contact holes at various pitches in low k applications.

Simulations performed by the inventors on 125 nm pitch contact holes using a 6% attenuating PSM and diagonal quadrupole (0.9/0.1) illumination showed image improvement when radially polarized light was used. The results from this simulation are shown in FIGS. 14A-14C. The results shown in FIG. 14 are also summarized in the following table:

| Polarization state | Minimum Contrast | Minimum NILS* |
|---|---|---|
| Unpolarized | 0.64 | 1.85 |
| Tangential | 0.58 | 1.77 |
| Radial | 0.69 | 1.94 |

*NILS stands for Normalized Image Log Slope

The present invention is not limited to quadrupole illumination. Further examples include, but are not limited to, quasar illumination, illumination having four-fold symmetry, or any other illumination approximating quadrupole illumination.

D. Polarization with Chromeless Alternating PSM

Further improvements in the resolvable pitch for contacts can be made by changing the mask from an attenuating phase-shift mask to an alternating phase shift mask while retaining the use of polarized light.

D.1. Chromeless Alternating PSM in Conjunction with Radially Polarized Light, 100-nm Pitch Nested Contacts The chromeless alternating PSM layouts chosen for this example study are of the checkerboard type in which the phase is alternated between, for example, 0° and 180°. A diagram of a chromeless alternating PSM 1500 is shown in FIG. 15. The center section of PSM 1500 is highlighted to showcase the different sections and phases. Sections 1502 and 1504 are areas that allow 100% of light to pass through with a phase of, for example, 0°.

Sections 1506 and 1508 are areas that allow 100% of light to pass through at a phase different from that of sections 1502 and 1504. For example, sections 1506 and 1508 may have a phase of 180°. Darkened area 1510 does not allow any light through. Therefore, its transmission is 0%.

The repeat pattern for printing 100-nm-pitch contact holes is composed of 100 nm transparent squares with alternating phases, as illustrated in FIG. 16. See, mask layouts in Levenson, M. D., et al., "The vortex mask: making 80 nm contacts with a twist!," *SPIE* 4889 (2002) and Grassman, A., et al., "Contact hole production by means of crossing sudden phase shift edges of a single phase mask," International patent WO 01/22164 A1 (2001). The resulting diffraction pattern for this contact array, with on-axis illumination for the chromeless mask, is shown in FIG. 17A.

With on-axis illumination, no diffraction orders are captured by the lens because the (0,0), (1,0), and (0,1) orders are extinct. With off-axis illumination, according to an embodiment of the present invention, the (1,1) family of diffraction orders can be moved into the pupil, as illustrated in FIG. 17B. An image can be obtained with this setup. With one pole, the image is equivalent to a 1D grating. By combining x-poles with y-poles, a 2D image is produced. FIGS. 18A and 18B illustrated this 2D image. This image can be enhanced by using the optimum polarization for the two interfering diffraction orders from each pole (in the case shown in FIG. 17B, x-polarized light is the optimum). This is like radially polarized poles with a Cartesian quadrupole.

Simulations in air and resist (FIGS. 18A-B) were for NA of 0.93, wavelength 157.6 nm, and the illumination was Cartesian quadrupole (the diagonal quadrupole presents no advantage but can be used). The four poles were radially polarized. Both the simulations in air and resist showed nearly perfect contrast as long as the contact holes were printed in negative photo-resist. NILS (calculated in air only) was very high (larger than 3, as shown in FIG. 18A).

D.2. Through-Pitch Behavior, Chromeless Contacts with Radially Polarized Light

"Forbidden" pitches in lithography have been described. See, Socha, R., et al., "Forbidden pitches for 130 nm lithography and below," *SPIE* 4000:1140 (2000), and Shi, X., et al., "Understanding the forbidden pitch phenomenon and assist feature placement," *SPIE* 4689:985 (2002). For a given illumination angle, the forbidden pitch lies in the location where the field produced by the neighboring features destructively interferes with the field of the main feature. Difficulties are encountered when attempting to print contact holes of a given size at different pitches. See, Graeupner et al. The inventors used common illumination conditions and a common threshold to mimic simultaneous exposure and to evaluate the extent of any overlapping process windows.

For this set of simulations, the size of the transparent phase squares that make up the chromeless mask (see FIG. 16) was gradually increased from 100 nm to 1000 nm in 25-nm steps. FIG. 19 shows the various images resulting from simulations at best focus for 200-nm, 300-nm, 400-nm, 500-nm, 600-nm, and 1000-nm pitches.

As a result of the present invention, the image of the contact generally remains particularly sharp and does not vary significantly in size with pitch. This is because the contact forms at the corners of the phase squares. One threshold necessary to print 50 nm contacts at 100-nm pitch has been calculated and found to be 0.28. At this threshold, side lobes are seen to develop for pitches of between 400 nm and 500 nm (see FIG. 19) and, hence, assist features are needed to prevent side lobes from printing at these particular pitches. Side lobes do not appear to be a problem at other pitches and assist features are therefore not required.

NILS and contact width have been calculated at the 0.28 threshold for all pitches (see FIGS. 20A and 20B, respectively). The contact width is the width of the image at the target threshold (0.28, in this case), and NILS is the log slope of the image width at the same threshold.

As shown in FIG. 20B, the contact width varies almost linearly with pitch for small pitches (approx. 200 nm); this is the regime in which the image is just the sum of orthogonal 1D gratings. Beyond this range, more diffracted orders are accommodated in the pupil. Although not shown here, the depth of focus (DOF) shows a change from infinite (with ideal mask, point source, and wave front) to finite, when more diffracted orders contribute to the image.

As shown in FIG. 20A, the NILS for all pitches under consideration in this example remains well above 2.5. This indicates good exposure latitude for all pitches. Contact width, on the other hand, varies from 50 nm to 105 nm (worst pitch) and stabilizes at about 65 nm. This is quite remarkable and has advantages of the simplicity of the mask layouts and the absence of a pitch-dependent pattern and illumination optimization. Compare, Graeupner et al., Socha, R., et al., and Shi, X., et al.

D.3. Custom Polarization

In an embodiment, custom polarized light is used in place of simple radial or tangential polarized light. FIG. 21A is a map of an example custom polarization pattern, where each arrow represents the direction of the field vectors at a specific section of the light beam. FIG. 21B is another map of an example custom polarization pattern. Unlike radial or tangential polarization, custom polarization patterns have a non-uniform arrangement of polarization vectors. These polarization vectors are shown as arrows in FIGS. 21A and 21B. In an embodiment, custom polarized light, as well as radial and tangential polarization, can be produced by a pattern polarizing device, such as pattern polarizing device 104 or 202. The pattern in the pattern polarizing device is predetermined, and the pattern polarization device can be changed as necessary to produce the desired polarization. The illumination configuration, or shape of the illumination light at the illumination source, can be customized as well. The ability to provide customized illumination, as well as customized polarization and intensity, optimizes printing.

E. Immersion Lithography

Another lithographic technique, immersion lithography, can also be used for the printing of contacts in the present invention. In immersion lithography at least the space between the projection optic, such as projection optic 108, and the wafer, such as wafer 110, is filled with a liquid. Using immersion lithography, it is possible to extend the pitch-resolution limits from 125 nm down to 100 nm. To simulate immersion lithography, the wavelength was scaled by the refractive index of the immersion liquid (e.g., 1.5). The liquid NA that could potentially be achieved with a suitable lens design is 1.395. FIG. 22 is an image of 50-nm contact holes at a 100-nm pitch simulated with immersion lithography according to the present invention. The NILS is in excess of 1.74; this indicates that this is a viable optical lithography technique for 50-nm contacts on a 100-nm pitch.

F. EUV

EUV was also examined, as it affords very short wavelength and, hence, has a high k factor at 100-nm pitch. An aerial image simulation of the image using typical EUV conditions (0.6 PC, 0.25 NA, and a binary contact-hole mask with unpolarized light) confirms that EUV can print very high-quality 50 nm contact images at 100 nm pitch. The result of a simulation using EUV according to the present invention is shown in FIG. 23.

NILS and contrast have both been found to be more than 0.7 and 2.5, respectively, over a 0.4-micron DOF; this indicates that EUV could, under the right conditions, provide robust imagery.

The inventors considered several approaches to the printing of 100-nm-pitch nested contact holes and found that 157-nm and high NA allows the printing of 134-nm-pitch contacts with good image quality. Further, radial polarization, in conjunction with a state-of-the-art approach at 157 nm (attenuated PSM, quadrupole, etc.), can result in a notable improvement compared with results produced using unpolarized light. The smallest pitch resolved with this technique is 125 nm. With radial polarization, C-quadrupole, chromeless alternating PSM and negative photo-resist, one can obtain nearly perfect contrast images of 100-nm-pitch contact holes at 157 nm. The inventors found this approach to be by far the best at 157 nm. Image quality remained almost constant through pitch and the inventors did not observe a forbidden pitch. The inventors discovered that immersion, at 157 nm and in a 1.5 refractive index hypothetical fluid, results in high-quality images at 100-nm pitch, while EUV conditions result in very high-quality images for 100-nm-pitch contacts.

The simulation results are summarized in the table below.

| Method | Wavelength (nm) | NA | Pitch (nm) | Contrast | NILS |
|---|---|---|---|---|---|
| Att PSM & unpolarized light | 157.6 | 0.93 | 134 | 0.5 | 1.55 |
| Att PSM & radial polarization | 157.6 | 0.93 | 125 | 0.51 | 1.47 |
| Chromeless PSM & radial polarization | 157.6 | 0.93 | 100 | 0.99 | 3.08 |
| Immersion | 157.6 | 1.395 | 100 | 0.62 | 1.74 |
| EUV | 13.4 | 0.25 | 100 | 0.99 | 5.27 |

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for printing on a wafer, comprising:
   a) polarizing a beam of radiation according to a determined polarization distribution, the determined polarization distribution being based upon a simulation of a pattern to be printed on the wafer;
   b) patterning the polarized beam of radiation; and
   c) projecting the patterned beam of radiation onto a target portion of the wafer.

2. The method of claim 1, wherein step (b) comprises patterning the polarized beam of radiation with contact holes.

3. The method of claim 1, wherein step (c) comprises projecting the patterned beam through an immersion fluid and onto the target portion of the wafer.

4. The method of claim 1, wherein step (a) further comprises polarizing the beam of radiation according to a radial polarization pattern.

5. The method of claim 1, wherein step (a) further comprises polarizing the beam of radiation according to a tangential polarization pattern.

6. The method of claim 1, wherein step (a) further comprises polarizing the beam of radiation according to a custom polarization pattern.

7. The method of claim 1, wherein step (a) further comprises polarizing a beam of extreme ultraviolet (EUV) radiation according to the determined polarization distribution.

8. A method for printing on a wafer, comprising:
   a) patterning a beam of radiation according to a pattern to be printed on the wafer;
   b) polarizing the patterned beam of radiation according to a determined polarization distribution, the determined polarization distribution being based upon a simulation of the pattern to be printed on the wafer; and
   c) projecting the polarized patterned beam of radiation onto a target portion of the wafer.

9. The method of claim 8, wherein step (a) further comprises patterning the beam of radiation according to a pattern having contact holes.

10. The method of claim 8, wherein step (b) further comprises polarizing the beam of radiation according to a radial polarization pattern.

11. The method of claim 8, wherein step (b) further comprises polarizing the beam of radiation according to a tangential polarization pattern.

12. The method of claim 8, wherein step (b) further comprises polarizing the beam of radiation according to a custom polarization pattern.

13. The method of claim 8, wherein step (a) further comprises using extreme ultraviolet (EUV) radiation as the beam of radiation.

14. A method for printing on a wafer, comprising:
   a) patterning a beam of radiation according to a pattern to be printed on the wafer;
   b) polarizing the patterned beam of radiation according to a determined polarization distribution, the determined polarization distribution being based upon a simulation of the pattern to be printed on the wafer; and
   c) projecting the polarized patterned beam of radiation through an immersion fluid and onto a target portion of the wafer.

15. The method of claim 14, wherein step (a) further comprises patterning the beam of radiation according to a pattern having contact holes.

16. The method of claim 14, wherein step (b) further comprises polarizing the beam of radiation according to a radial polarization pattern.

17. The method of claim 14, wherein step (b) further comprises polarizing the beam of radiation according to a tangential polarization pattern.

18. The method of claim 14, wherein step (b) further comprises polarizing the beam of radiation according to a custom polarization pattern.

19. The method of claim 14, wherein step (a) further comprises using extreme ultraviolet (EUV) radiation as the beam of radiation.

* * * * *